(12) United States Patent
Nakajima et al.

(10) Patent No.: US 10,845,703 B2
(45) Date of Patent: Nov. 24, 2020

(54) FILM-FORMING COMPOSITION CONTAINING SILICONE HAVING CROSSLINKING REACTIVITY

(71) Applicant: NISSAN CHEMICAL INDUSTRIES, LTD., Tokyo (JP)

(72) Inventors: Makoto Nakajima, Toyama (JP); Kenji Takase, Funabashi (JP); Masahisa Endo, Toyama (JP); Hiroyuki Wakayama, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 276 days.

(21) Appl. No.: 15/528,037

(22) PCT Filed: Nov. 9, 2015

(86) PCT No.: PCT/JP2015/081476
§ 371 (c)(1),
(2) Date: May 18, 2017

(87) PCT Pub. No.: WO2016/080226
PCT Pub. Date: May 26, 2016

(65) Prior Publication Data
US 2018/0335698 A1 Nov. 22, 2018

(30) Foreign Application Priority Data

Nov. 19, 2014 (JP) .................................. 2014-234590

(51) Int. Cl.
*G03F 7/11* (2006.01)
*C07F 7/18* (2006.01)
(Continued)

(52) U.S. Cl.
CPC .............. *G03F 7/11* (2013.01); *C07F 7/1804* (2013.01); *C08G 77/14* (2013.01); *C08G 77/18* (2013.01);
(Continued)

(58) Field of Classification Search
CPC ....... C09D 183/16; G03F 7/0752; G03F 7/11; Y10S 430/128
See application file for complete search history.

(56) References Cited

U.S. PATENT DOCUMENTS 3,427,339 A 2/1969 Plueddemann
3,427,340 A 2/1969 Plueddemann
(Continued)

FOREIGN PATENT DOCUMENTS

EP 1908472 A1 4/2008
JP H03-275769 A 12/1991
(Continued)

OTHER PUBLICATIONS

Oct. 5, 2017 Written Opinion issued in Singapore Patent Application No. 11201704070S.
(Continued)

*Primary Examiner* — Ermias T Woldegeorgis
(74) *Attorney, Agent, or Firm* — Oliff PLC

(57) ABSTRACT

A film-forming composition having favorable effects such as curability and embeddability and resist underlayer film for use in lithography process for semiconductor devices. The film-forming composition including, as silane, hydrolyzable silane, hydrolysis product thereof, or hydrolysis-condensation product thereof, wherein hydrolyzable silane includes hydrolyzable silane of Formula (1):

$$R^1_a R^2_b Si(R^3)_{4-(a+b)} \quad \text{Formula (1)}$$

(Continued)

in Formula (1), $R^1$ is organic group of Formula (2) and is bonded to silicon atom through Si—C bond:

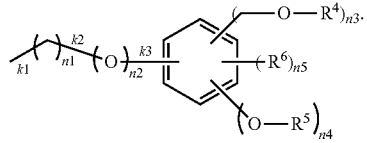

Formula (2)

The film-forming composition, wherein the hydrolyzable silane is combination of hydrolyzable silane of Formula (1) with another hydrolyzable silane, wherein other hydrolyzable silane is at least one selected from group made of hydrolyzable silane of Formula (3):

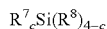

Formula (3)

and hydrolyzable silane of Formula (4):

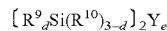

Formula (4)

Resist underlayer film, obtained by applying the resist underlayer film-forming composition on semiconductor substrate and baking.

9 Claims, 1 Drawing Sheet

(51) Int. Cl.

| | | |
|---|---|---|
| *H01L 21/027* | (2006.01) | |
| *C09D 183/00* | (2006.01) | |
| *C08G 77/14* | (2006.01) | |
| *C08G 77/18* | (2006.01) | |
| *C09D 183/06* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |

(52) U.S. Cl.
CPC ......... *C09D 183/00* (2013.01); *C09D 183/06* (2013.01); *G03F 7/162* (2013.01); *G03F 7/168* (2013.01); *G03F 7/2004* (2013.01); *G03F 7/322* (2013.01); *G03F 7/38* (2013.01); *H01L 21/027* (2013.01); *H01L 21/0274* (2013.01)

(56) References Cited

U.S. PATENT DOCUMENTS

| | | | |
|---|---|---|---|
| 3,461,027 A | 8/1969 | Plueddemann et al. | |
| 5,648,201 A | 7/1997 | Dulcey et al. | |
| 6,025,117 A | 2/2000 | Nakano et al. | |
| 2008/0318158 A1* | 12/2008 | Takei | C09D 183/16 430/272.1 |
| 2013/0183830 A1 | 7/2013 | Takeda et al. | |
| 2014/0170855 A1 | 6/2014 | Nakajima et al. | |
| 2015/0316849 A1 | 11/2015 | Kanno et al. | |
| 2015/0322212 A1 | 11/2015 | Kanno et al. | |

FOREIGN PATENT DOCUMENTS

| | | | |
|---|---|---|---|
| JP | H11-060735 A | | 3/1999 |
| JP | 2009-537645 A | | 10/2009 |
| JP | 2010100591 A | * | 5/2010 |
| JP | 2011-170059 A | | 9/2011 |
| WO | 2006/126406 A1 | | 11/2006 |
| WO | 2007/131985 A1 | | 11/2007 |

OTHER PUBLICATIONS

Leigh, William J., "Intramolecular Nucleophile-Induced Photorearrangements and Silene Formation from an o-(Methoxymethyl)phenylsilacyclobutane", Journal of American Chemical Society, 2003, pp. 8096-8097.
Schoeller, Wolfgang W., "Pentacoordination at Fluoro-Substituted Silanes by Weak Lewis Donor Addition," European Journal of Inorganic Chemistry, 2000, pp. 375-381.
Mix, A. et al., "2-(Alkoxymethyl) phenylsilicon compounds: the search for pentacoordination," Journal of Organometallic Chemistry, 1996, pp. 177-183.
Jul. 8, 2013, Reigstry (STN), CAS Registry No. 1443325-86-7.
Kostikov, Alexey P. et al., "Oxalic Acid Supported Si-18F-Radiofluorination: One-Step Radiosynthesis of N-Succinimidyl 3-(Di-tert-butyl[18F]fluorosilyl) benzoate ([18F]SiFB) for Protein Labeling," Bioconjugate Chemistry, 2012, pp. 106-114.
Berends, Ljuba Iovkova et al., "t-Bu2SiF-Derivatized D2-Receptor Ligands: The First SiFA-Containing Small Molecule Radiotracers for Target-Specific PET-Imaging," Molecules, 2011, vol. 16, pp. 7458-7479.
Iovkova, Ljuba et al., "para-Functionalized Aryl-di-tert-butylfluorosilanes as Potential Labeling Synthons for 18F Radiopharmaceuticals," Chemistry, 2009, pp. 2140-2147.
Höhne, Aileen et al., "Organofluorosilanes as Model Compounds for 18F-Labeled Silicon-Based PET Tracers and their Hydrolytic Stability: Experimental Data and Theoretical Calculations (PET= Positron Emission Tomography)", Chemistry—A European Journal, 2009, pp. 3736-3743.
Bockholt, Andreas et al., "Neutral and Catonic Silicon Species Containing Aryl-OCO- or Aryl-SCS-Type Pincer Ligands: Synthesis, Structure, Bonding, and Comparison with Aryl-NCN Systems," Zeitschrift fuer Anorganische und Allgemine Chemie, 2009, vol. 635, pp. 1326-1334.
Feb. 16, 2016 Written Opinion issued in International Patent Application No. PCT/JP2015/081476.
Feb. 16, 2016 International Search Report issued in International Patent Application No. PCT/JP2015/081476.
May 25, 2018 Extended European Search Report issued in European Application No. 15 86 0187.2.

* cited by examiner

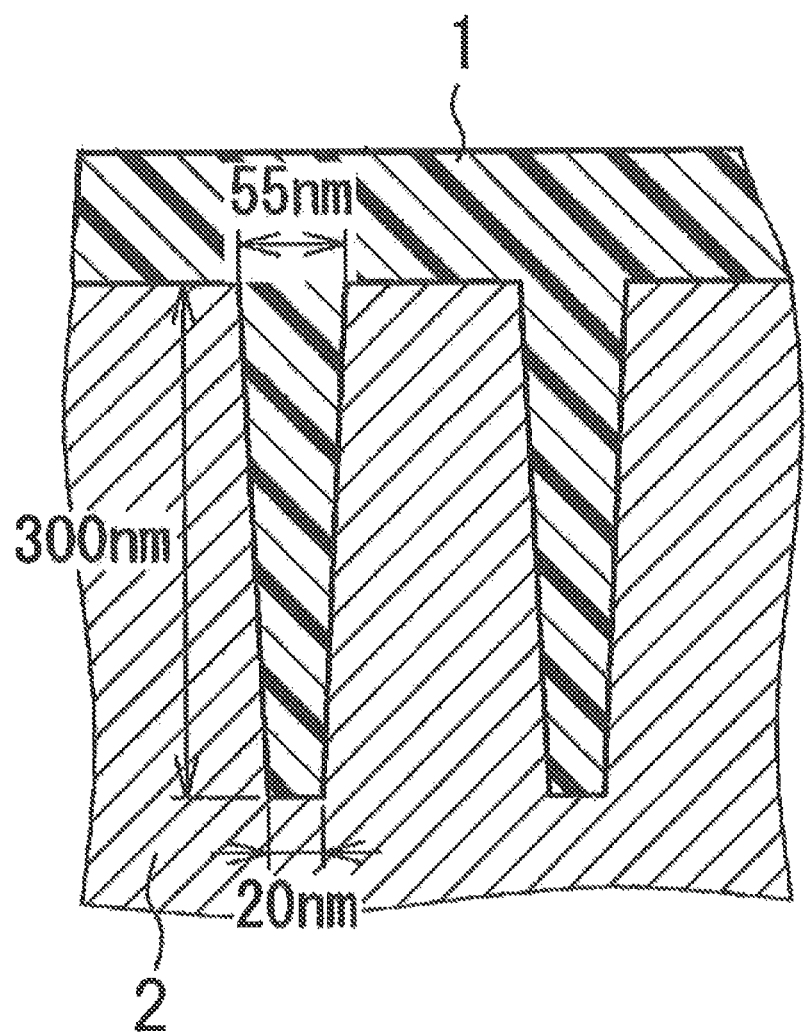

FILM-FORMING COMPOSITION CONTAINING SILICONE HAVING CROSSLINKING REACTIVITY

TECHNICAL FIELD

The present invention relates to a film-forming composition including a hydrolyzable silane having a cross-linking reactive group.

BACKGROUND ART

A variety of materials are used in the form of films, coatings, and coats. Among these materials, for example, siloxane materials are used for improving heat resistance, transparency, plasma resistance, planarization property, and the like. In these materials, the technique of siloxane cross-linking by dehydration and condensation of silanol is generally adopted. Another method for causing cross-linking is introducing acrylate groups into a silicone polymer (see Patent Document 1). It is shown that these groups can be cross-linked and cured by radiation of UV light.

Organosiloxane using methylol cross-linking is also proposed (see Patent Document 2).

More specifically, it is proposed to cross-link an organopolysiloxane using a composition including at least two organopolysiloxane units and a nitrogen-containing compound having methylol group.

It is also proposed to use a composition having a cross-linking material using methylol cross-linking as a resist underlayer for use in the lithography process for semiconductor devices (see Patent Document 3).

PRIOR ART DOCUMENTS

Patent Documents

Patent Document 1: Japanese Patent Application Publication No. H3-275769 (JP H3-275769 A)
Patent Document 2: Japanese Patent Application Publication No. 2009-537645 (JP 2009-537645 A)
Patent Document 3: Japanese Patent Application Publication No. 2011-170059 (JP 2011-170059 A)

SUMMARY OF THE INVENTION

Problem to be Solved by the Invention

In conventional polysiloxanes having cross-linkability, a cross-linking reaction occurs between the functional group built in the side chain of a polysiloxane, for example, the functional group such as carboxy group, hydroxy group, and epoxy group, and a cross-linkable compound.

In these cross-linking systems, a low-molecular cross-linking agent is involved in a cross-linking reaction, and cross-linking failures often occur.

The present invention is aimed to provide a composition that forms a sufficiently strong cross-linked structure and is highly resistant against chemicals, by introducing alkoxymethylphenyl group causing a cross-linking reaction to the side chain of a polysiloxane to allow the cross-linking group to mutually form a cross-linked structure or form a cross-linked structure with another component.

Means for Solving the Problem

The present invention provides:

according to a first aspect, a film-forming composition comprising, as a silane, a hydrolyzable silane, a hydrolysis product thereof, or a hydrolysis-condensation product thereof, in which the hydrolyzable silane includes a hydrolyzable silane of Formula (1):

$$R^1_a R^2_b Si(R^3)_{4-(a+b)} \quad \text{Formula (1)}$$

[in Formula (1), $R^1$ is an organic group of Formula (2) and is bonded to a silicon atom through a Si—C bond or a Si—O bond:

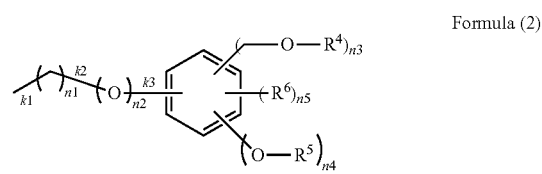

Formula (2)

(in Formula (2), $R^4$ is a hydrogen atom, a $C_{1-10}$ alkyl group, or an acyl group, $R^5$ is a hydrogen atom, a $C_{1-10}$ alkyl group, or a $C_{1-10}$ alkyl group having a $C_{1-10}$ alkoxy group, $R^6$ is a $C_{1-10}$ alkyl group, n1 is an integer of 0 to 10, n2 is an integer of 0 or 1, n3, n4 and n5 are integers, where n3 satisfies $1 \leq n3 \leq 5$, n4 satisfies $0 \leq n4 \leq 4$, and n5 satisfies $0 \leq n5 \leq 4$, k1 is a bond end with a silicon atom when n1 is 1 to 10, k2 is a bond end with a silicon atom when n1 is 0 and n2 is 1, and k3 is a bond end with a silicon atom when n1 and n2 are 0); $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond; $R^3$ is an alkoxy group, an acyloxy group, or a halogen group; a is an integer of 1; b is an integer of 0 to 2; and a+b is an integer of 1 to 3];

according to a second aspect, the film-forming composition according to the first aspect, in which the hydrolyzable silane is a combination of the hydrolyzable silane of Formula (1) with another hydrolyzable silane, in which the other hydrolyzable silane is at least one hydrolyzable silane selected from the group consisting of a hydrolyzable silane of Formula (3):

$$R^7_c Si(R^8)_{4-c} \quad \text{Formula (3)}$$

(in Formula (3), $R^7$ is an alkyl group, an aryl group, a halogenated alkyl group, a halogenated aryl group, an alkoxyalkyl group, an alkoxyaryl group, an alkoxyalkoxyaryl group, an alkenyl group, or an organic group having an epoxy group, an acryloyl group, a methacryloyl group, a mercapto group, a sulfonamide group, or a cyano group, or a combination thereof, and is bonded to a silicon atom through a Si—C bond, $R^8$ is an alkoxy group, an acyloxy group, or a halogen group, and c is an integer of 0 to 3), and a hydrolyzable silane of Formula (4):

$$[R^9_d Si(R^{10})_{3-d}]_2 Y_e \quad \text{Formula (4)}$$

(in Formula (4), $R^9$ is an alkyl group and is bonded to a silicon atom through a Si—C bond, $R^{10}$ is an alkoxy group, an acyloxy group, or a halogen group, Y is an alkylene group or an arylene group, d is an integer of 0 or 1, and e is an integer of 0 or 1);

according to a third aspect, a film-forming composition comprising, as a polymer, a hydrolysis-condensation product of a hydrolyzable silane composed of a combination of the hydrolyzable silane of Formula (1) in the first aspect and the hydrolyzable silane of Formula (3) in the second aspect;

according to a fourth aspect, the film-forming composition according to any one of the first aspect to the third aspect, further comprising a salt;

according to a fifth aspect, the film-forming composition according to any one of the first aspect to the fourth aspect, in which the film-forming composition is a resist underlayer film-forming composition for use in a lithography process;

according to a sixth aspect, a resist underlayer film formed on a semiconductor substrate, comprising a cured product of the resist underlayer film-forming composition in the fifth aspect;

according to a seventh aspect, a method of producing a semiconductor device comprising the steps of: applying the resist underlayer film-forming composition in the fifth aspect on a semiconductor substrate and baking the resist underlayer film-forming composition to form a resist underlayer film; applying a resist composition on the resist underlayer film to form a resist film; exposing the resist film; developing the resist film after exposure to obtain a resist pattern; etching the resist underlayer film using the resist pattern; and processing the semiconductor substrate using the patterned resist and resist underlayer film;

according to an eighth aspect, a method of producing a semiconductor device comprising the steps of: forming an organic underlayer film on a semiconductor substrate; applying the resist underlayer film-forming composition in the fifth aspect on the organic underlayer film and baking the resist underlayer film-forming composition to form a resist underlayer film; applying a resist composition on the resist underlayer film to form a resist film; exposing the resist film; developing the resist film after exposure to obtain a resist pattern; etching the resist underlayer film using the resist pattern; etching the organic underlayer film using the patterned resist underlayer film; and processing the semiconductor substrate using the patterned organic underlayer film; and according to a ninth aspect, a hydrolyzable silane of Formula (1'):

   Formula (1')

[in Formula (1'), $R^1$ is an organic group of Formula (2') and is bonded to a silicon atom through a Si—C bond or a Si—O bond:

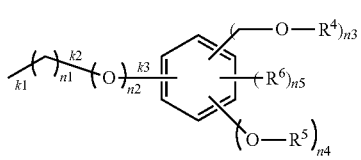   Formula (2')

(in Formula (2'), $R^4$ is a hydrogen atom, a $C_{1-10}$ alkyl group, or an acyl group, $R^5$ is a hydrogen atom, a $C_{1-10}$ alkyl group, or a $C_{1-10}$ alkyl group having a $C_{1-10}$ alkoxy group, $R^6$ is a $C_{1-10}$ alkyl group, n1 is an integer of 0 to 10, n2 is an integer of 0 or 1, n3, n4, and n5 are integers, where n3 satisfies 1≤n3≤5, n4 satisfies 0≤n4≤4, and n5 satisfies 0≤n5≤4, k1 is a bond end with a silicon atom when n1 is 1 to 10, k2 is a bond end with a silicon atom when n1 is 0 and n2 is 1, and k3 is a bond end with a silicon atom when n1 and n2 are 0); $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond; $R^3$ is an alkoxy group, an acyloxy group, or a halogen group; a is an integer of 1; b is an integer of 0 to 2; and a+b is an integer of 1 to 3].

Effects of the Invention

In the present invention, in the silane component, alkoxymethylphenyl group or the like causing a cross-linking reaction is introduced to the side chain of a polysiloxane to allow this cross-linking group to mutually form a cross-linking reaction with electron-rich phenyl group. This alkoxymethylphenyl group can form a cross-linked structure also with another hydroxy group and can form a sufficiently strong cross-linked structure. Therefore, the film formed after curing the composition of the present invention is excellent mechanically as well as in resistance against chemicals.

The film-forming composition of the present invention can form such excellent films and therefore can be used as a film-forming composition for various applications. An example of the usage is a resist underlayer film-forming composition for forming a resist underlayer film for use in a multilayer process in semiconductor lithography using the etching resistance that siloxane intrinsically has. Typically, the resist is thinned in order to prevent pattern collapse involved with scaling-down of patterns. In doing so, using that the etching rate ratio of the siloxane layer and the organic layer is changed by combining etching gasses, the process is performed such that a resist pattern is transferred to the underlying silicon hard mask and further transferred to the underlying organic underlayer film, and finally the silicon substrate is processed. The film-forming composition of the present invention can also be used as a composition for forming the silicon hard mask (resist underlayer film) used in this process.

The film-forming composition of the present invention is a silicone-based composition and can be used as a hole-filling material for the substrate required to have planarization property, by controlling the degree of curing by controlling the temperatures at which a cross-linking reaction is caused by alkoxymethylphenyl group. Since the fluidity of the film-forming composition of the present invention is kept in a temperature range lower than the temperature at which a cross-linking reaction by alkoxymethylphenyl group occurs, first, minute holes on the substrate are filled with the composition kept at a temperature lower than the temperature causing a cross-linking reaction, and then the temperature is increased to cause a cross-linking reaction, whereby a highly planarized film can be formed with minute holes filled sufficiently.

BRIEF DESCRIPTION OF THE DRAWINGS

FIG. 1 is a cross-sectional view of an uneven substrate used in a hole-filling evaluation test.

MODES FOR CARRYING OUT THE INVENTION

The present invention provides a film-forming composition including, as a silane, a hydrolyzable silane, a hydrolysis product thereof, or a hydrolysis-condensation product thereof. The hydrolyzable silane includes a hydrolyzable silane of Formula (1).

The film-forming composition of the present invention includes the hydrolyzable silane of Formula (1), a hydrolysis product thereof, or a hydrolysis-condensation product thereof, and a solvent. The film-forming composition of the present invention may optionally include an acid, water, an alcohol, a curing catalyst, an acid generator, another organic polymer, a light-absorptive compound, a surfactant, and the like.

The solid content in the film-forming composition of the present invention is, for example, 0.1 to 50% by mass, or 0.1 to 30% by mass, 0.1 to 25% by mass. As used herein, the solid content refers to the content obtained by removing the solvent component from all the components of the film-forming composition.

The proportion of the hydrolyzable silane, the hydrolysis product thereof, and the hydrolysis-condensation product thereof in the solid content is 20% by mass or more, for example, 50 to 100% by mass, 60 to 99%/by mass, 70 to 99% by mass.

The hydrolyzable silane, the hydrolysis product thereof, and the hydrolysis-condensation product thereof can be used in the form of a mixture thereof. The condensation product obtained by hydrolyzing a hydrolyzable silane and condensing the resultant hydrolysis product may be used. When a hydrolysis-condensation product is obtained, a partial hydrolysis product in which hydrolysis is not completed or a mixture including a silane compound mixed with the hydrolysis-condensation product may be used. This condensation product is a polymer having a polysiloxane structure. This polysiloxane includes the hydrolyzable silane of Formula (1), or a hydrolysis-condensation product of the hydrolyzable silane of Formula (1) and another hydrolyzable silane (for example, the hydrolyzable silane of Formula (3)). Alternatively, the hydrolyzable silane of Formula (1), or a hydrolyzable silane composed of a mixture of the hydrolyzable silane of Formula (1) and the hydrolyzable silane of Formula (3) can be added to the hydrolyzable silane of Formula (1), or a hydrolysis-condensation product (polysiloxane) of a hydrolysis product of a hydrolyzable silane composed of a combination of the hydrolyzable silane of Formula (1) and the hydrolyzable silane of Formula (3).

In Formula (1), $R^1$ is an organic group of Formula (2) and is bonded to a silicon atom through a Si—C bond or a Si—O bond. $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond. $R^3$ is an alkoxy group, an acyloxy group, or a halogen group. Then, a is an integer of 1, b is an integer of 0 to 2, and a+b is an integer of 1 to 3.

In Formula (2), $R^4$ is a hydrogen atom, a $C_{1-10}$ alkyl group, or an acyl group, $R^5$ is a hydrogen atom, a $C_{1-10}$ alkyl group, or a $C_{1-10}$ alkyl group having a $C_{1-10}$ alkoxy group, $R^6$ is a $C_{1-10}$ alkyl group, n1 is an integer of 0 to 10, n2 is an integer of 0 or 1, n3, n4, and n5 are integers, where n3 satisfies 1≤n3≤5, n4 satisfies 0≤n4≤4, and n5 satisfies 0≤n5≤4. The k1 portion, the k2 portion, or the k3 portion is a bond end with a silicon atom, k1 is a bond end with a silicon atom when n1 is 1 to 10, k2 is a bond end with a silicon atom when n1 is 0 and n2 is 1, and k3 is a bond end with a silicon atom when n1 and n2 are 0. In the k1 portion, the one bonded to a silicon atom can be selected.

The alkyl group is, for example, a $C_{1-10}$ alkyl group, and examples thereof include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, l-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The aryl group is, for example, a $C_{6-40}$ aryl group, and examples thereof include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, a-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

The alkenyl group is, for example, a $C_{2-10}$ alkenyl group, and examples thereof include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

The acyl group is, for example, a $C_{2-10}$ acyl group, and examples thereof include methylcarbonyl group, ethylcarbonyl group, n-propylcarbonyl group, i-propylcarbonyl group, cyclopropylcarbonyl group, n-butylcarbonyl group, i-butylcarbonyl group, s-butylcarbonyl group, t-butylcarbonyl group, cyclobutylcarbonyl group, 1-methyl-cyclopropylcarbonyl group, 2-methyl-cyclopropylcarbonyl group, n-pentylcarbonyl group, 1-methyl-n-butylcarbonyl group, 2-methyl-n-butylcarbonyl group, 3-methyl-n-butylcarbonyl group, 1,1-dimethyl-n-propylcarbonyl group, 1,2-dimethyl-n-propylcarbonyl group, 2,2-dimethyl-n-propylcarbonyl group, 1-ethyl-n-propylcarbonyl group, cyclopentylcarbonyl group, 1-methyl-cyclobutylcarbonyl group, 2-methyl-cyclobutylcarbonyl group, 3-methyl-cyclobutylcarbonyl group, 1,2-dimethyl-cyclopropylcarbonyl group, 2,3-dimethyl-cyclopropylcarbonyl group, 1-ethyl-cyclopropylcarbonyl group, 2-ethyl-cyclopropylcarbonyl group, n-hexylcarbonyl group, 1-methyl-n-pentylcarbonyl group, 2-methyl-n-pentylcarbonyl group, 3-methyl-n-pentylcarbonyl group, 4-methyl-n-pentylcarbonyl group, 1,1-dimethyl-n-butylcarbonyl group, 1,2-dimethyl-n-butylcarbonyl group, 1,3-dimethyl-n-butylcarbonyl group, 2,2-dimethyl-n-butylcarbonyl group, 2,3-dimethyl-n-butylcarbonyl group, 3,3-dimethyl-n-butylcarbonyl group, 1-ethyl-n-butylcarbonyl group, 2-ethyl-n-butylcarbonyl group, and 1,1,2-trimethyl-n-propylcarbonyl group.

Examples of the organic group having an epoxy group include glycidoxymethyl, glycidoxyethyl, glycidoxypropyl, glycidoxybutyl, and epoxycyclohexyl.

Examples of the organic group having an acryloyl group include acryloylmethyl, acryloylethyl, and acryloylpropyl.

Examples of the organic group having a methacryloyl group include methacryloylmethyl, methacryloylethyl, and methacryloylpropyl.

Examples of the organic group having a mercapto group include ethylmercapto, butylmercapto, hexylmercapto, and octylmercapto.

Examples of the organic group having an amino group include amino group, aminomethyl group, and aminoethyl group.

Examples of the organic group having a cyano group include cyanoethyl and cyanopropyl.

Examples of the $C_{1-20}$ or $C_{1-10}$ alkoxy group include alkoxy groups having a linear, branched, or cyclic alkyl moiety having a carbon atom number of 1 to 20, such as methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Examples of the $C_{2-20}$, $C_{1-10}$ acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n- propylcarbonyloxy group, 1-ethyl-2-methyl-n-propylcarbonyloxy group, phenylcarbonyloxy group, and tosylcarbonyloxy group.

Examples of the halogen group include fluorine, chlorine, bromine, and iodine.

The hydrolyzable silane can be used as a combination of the hydrolyzable silane of Formula (1) and another hydrolyzable silane.

As another hydrolyzable silane, at least one hydrolyzable silane selected from the group consisting of Formula (3) and Formula (4) can be used.

In Formula (3), $R^7$ is an alkyl group, an aryl group, a halogenated alkyl group, a halogenated aryl group, an alkoxyalkyl group, an alkoxyaryl group, an alkoxyalkoxyaryl group, an alkenyl group, or an organic group having an epoxy group, an acryloyl group, a methacryloyl group, a mercapto group, a sulfonamide group, or a cyano group, or a combination thereof, and is bonded to a silicon atom through a Si—C bond, $R^8$ is an alkoxy group, an acyloxy group, or a halogen group, and c is an integer of 0 to 3.

In Formula (4), $R^9$ is an alkyl group and is bonded to a silicon atom through a Si—C bond, $R^{10}$ is an alkoxy group, an acyloxy group, or a halogen group, Y is an alkylene group or an arylene group, d is an integer of 0 or 1, and e is an integer of 0 or 1.

Those illustrated above can be used as the alkyl group, the aryl group, the halogenated alkyl group, the halogenated aryl group, the alkoxyalkyl group, the alkoxyaryl group, the alkoxyalkoxyaryl group, the alkenyl group, or the organic group having an epoxy group, an acryloyl group, a methacryloyl group, a mercapto group, a sulfonamide group, or a cyano group, the alkoxy group, the acyloxy group, and the halogen group.

The alkoxyalkyl group is an alkyl group in which alkoxy group is substituted, and examples thereof include methoxymethyl group, ethoxymethyl group, ethoxyethyl group, and ethoxymethyl group.

The alkoxyaryl group is an aryl group in which alkoxy group is substituted, and examples thereof include methoxyphenyl group and ethoxyphenyl group.

The alkoxyalkoxyaryl group is an aryl group in which the organic group in which alkoxy group is substituted with alkoxy group is substituted, and examples thereof include methoxymethoxyphenyl group, methoxyethoxyphenyl group, ethoxymethoxyphenyl group, and ethoxyethoxyphenyl group.

The film-forming composition can include, as a polymer, a hydrolysis-condensation product of a hydrolyzable silane composed of a combination of the hydrolyzable silane of Formula (1) and the hydrolyzable silane of Formula (3).

Examples of the hydrolyzable silane of Formula (1) are illustrated below.

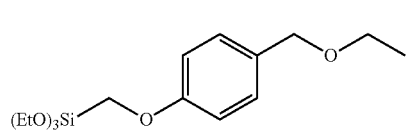

Formula (1-1)

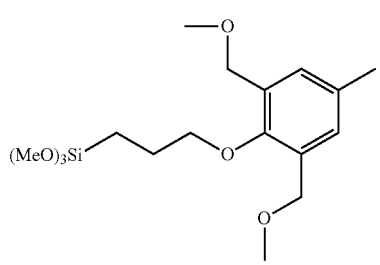

Formula (1-2)

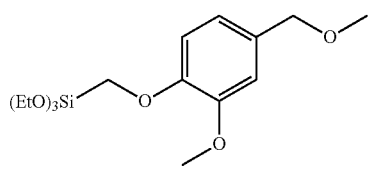

Formula (1-3)

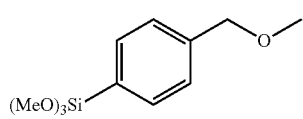

Formula (1-4)

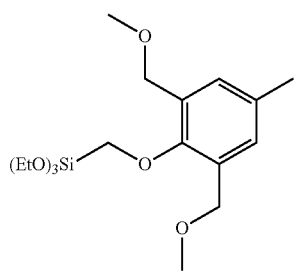

Formula (1-5)

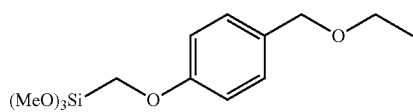

Formula (1-6)

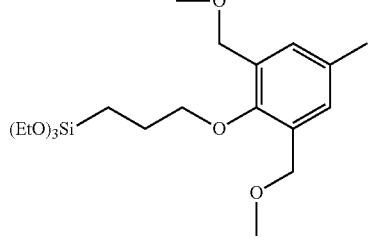

Formula (1-7)

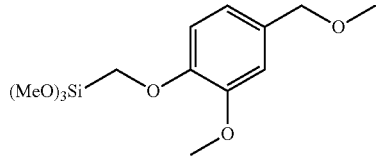

Formula (1-8)

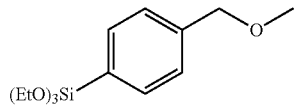

Formula (1-9)

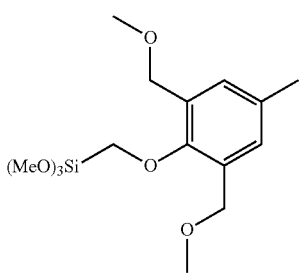

Formula (1-10)

In the formulae above, Me is a methyl group and Et is an ethyl group. In the following description, these abbreviations may be used.

In the present invention, the hydrolyzable silane is a combination of the hydrolyzable silane of Formula (1) and another hydrolyzable silane. At least one hydrolyzable silane selected from the group consisting of Formula (3) and Formula (4) can be used as another hydrolyzable silane.

Examples of the silicon-containing compound of Formula (3) include tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxysilane, methyltributoxysilane, methyltriamyloxysilane, methyltriphenoxysilane, tnethyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-gycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltriniethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane. α-glycidoxyethylmethyldiethoxysilane, β-glycidoxyethylmethyldimethoxysilane, β-glycidoxyethylethyldimethoxysilane. α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, miethoxybenzyltriacetoxysilane, methoxybenzyltrichlorosilane, inethoxyphenethyltrimethoxysilane, methoxyphenethyltriethoxysilane, methoxyphenethyltriacetoxysilane, methoxyphenethyltrichlorosilane, ethoxyphenyltriinethoxysilane, ethoxyphenyltriethoxysilane, ethoxyphenyltriacetoxysilane, ethoxyphenyltrichlorosilane, ethoxybenzyltrimethoxysilane, ethoxybenziltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrirnethi xysilanc, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltritnethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

The hydrolyzable silanes below may be used.

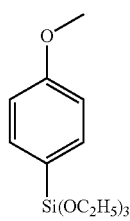

Formula (A-1)

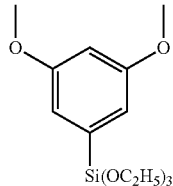

Formula (A-2)

Formula (A-3)
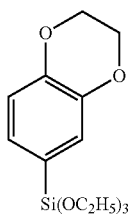
Formula (A-4)
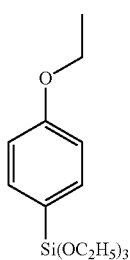
Formula (A-5)
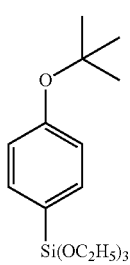
Formula (A-6)
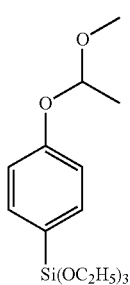
Formula (A-7)
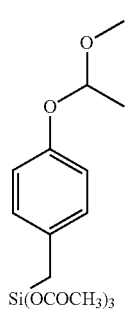
Formula (A-8)
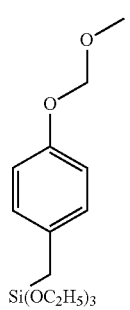
Formula (A-9)
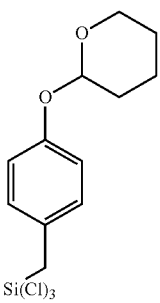
Formula (A-10)
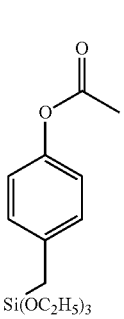
Formula (A-11)
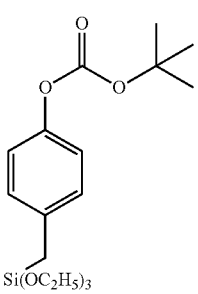
Formula (A-12)
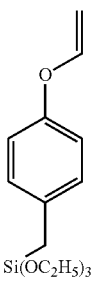
Formula (A-13)
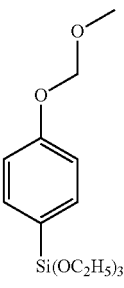

Formula (A-14)
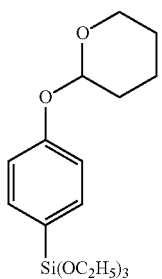
Formula (A-15)
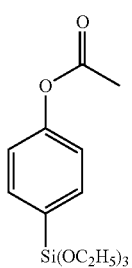
Formula (A-16)
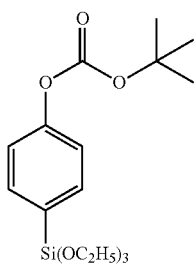
Formula (A-17)
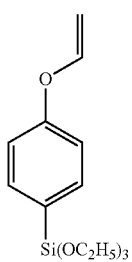
Formula (A-18)
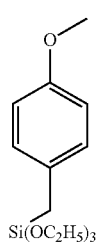
Formula (A-19)
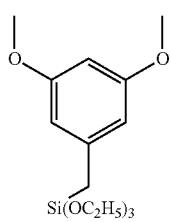
Formula (A-20)
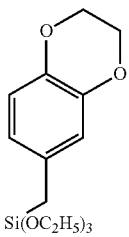
Formula (A-21)
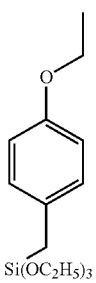
Formula (A-22)
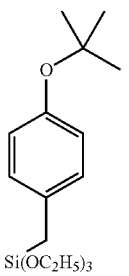
Formula (A-23)
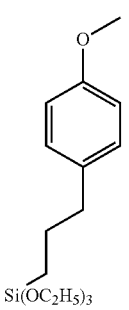
Formula (A-24)
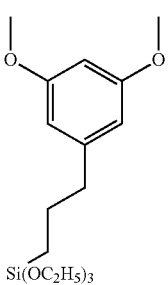

Formula (A-25)
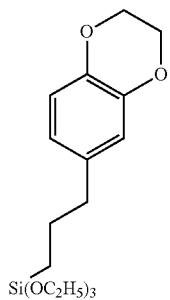
Formula (A-26)
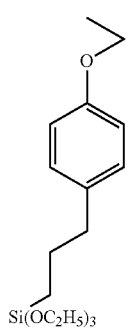
Formula (A-27)
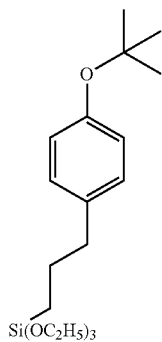
Formula (A-28)
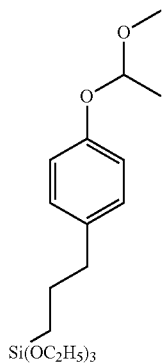
Formula (A-29)
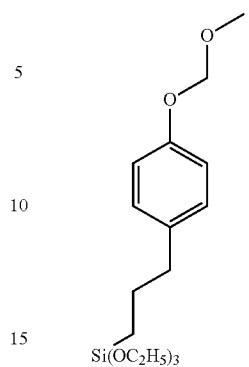
Formula (A-30)
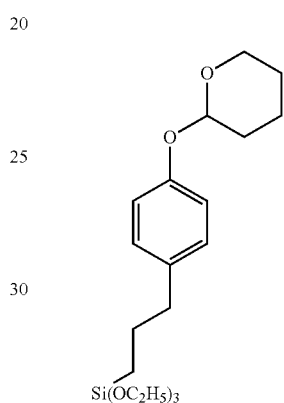
Formula (A-31)
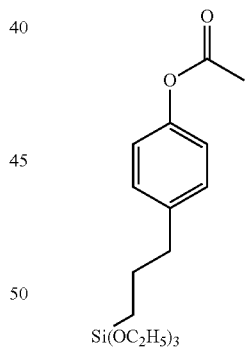
Formula (A-32)
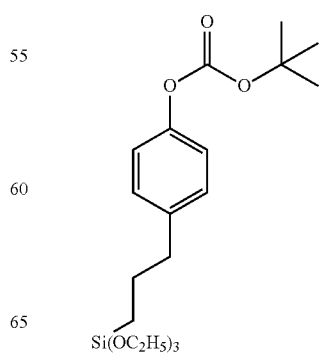

-continued

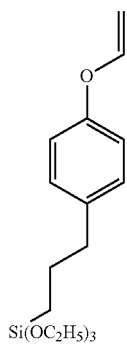

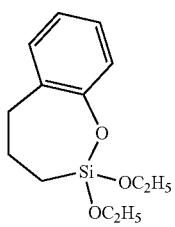

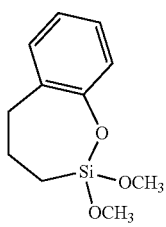

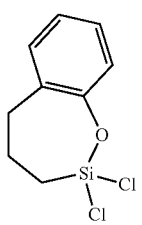

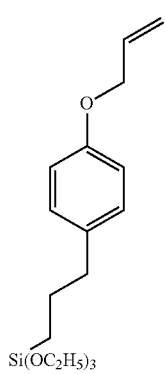

-continued

Formula (A-33)

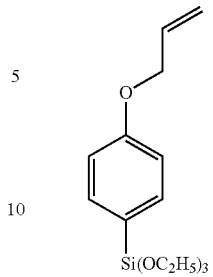

Formula (A-34)

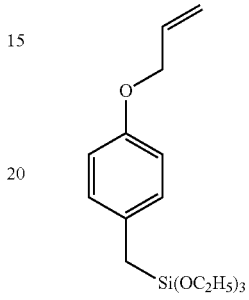

Formula (A-35)

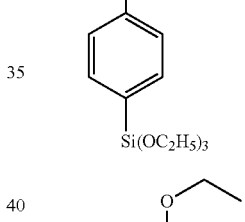

Formula (A-36)

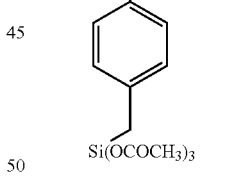

Formula (A-37)

Formula (A-38)

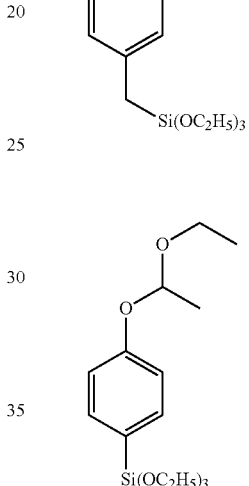

Formula (A-39)

Formula (A-40)

Formula (A-41)

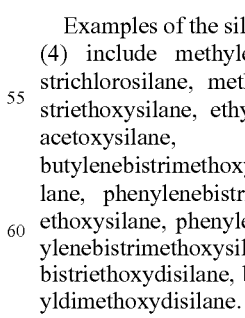

Examples of the silicon-containing compound of Formula (4) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

In the present invention, silanes having sulfone group or silanes having sulfonamide group may further be used as the hydrolyzable silane, and examples thereof can be illustrated below.

Formula (B-1)
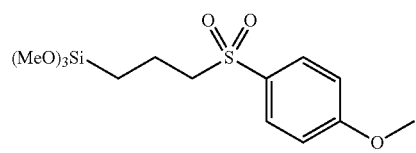
Formula (B-2)
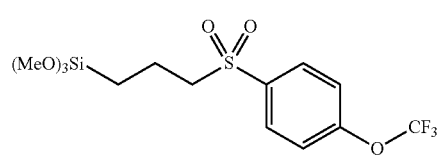
Formula (B-3)
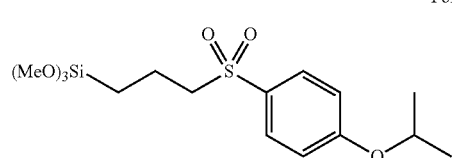
Formula (B-4)
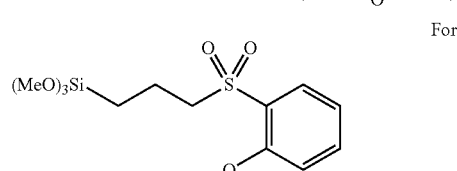
Formula (B-5)
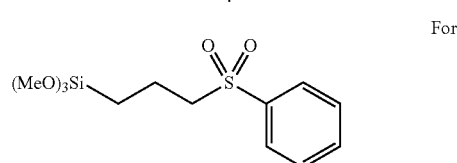
Formula (B-6)
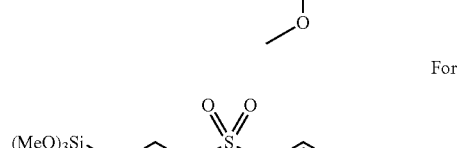
Formula (B-7)
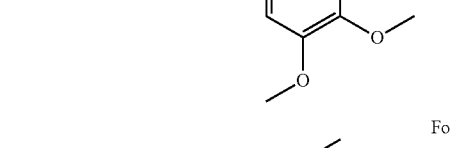
Formula (B-8)
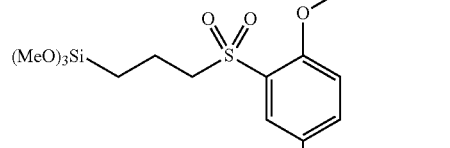
-continued
Formula (B-9)
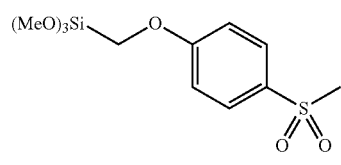
Formula (B-10)
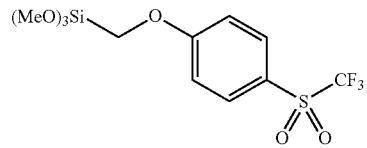
Formula (B-11)
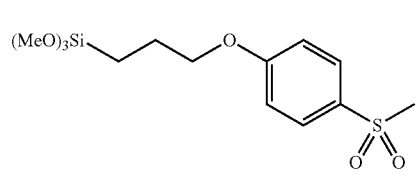
Formula (B-12)
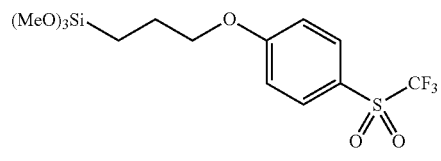
Formula (B-13)
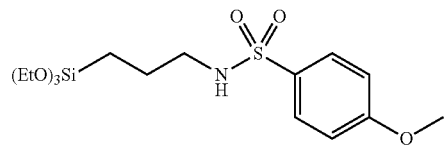
Formula (B-14)
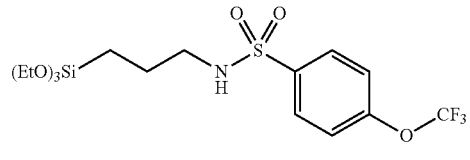
Formula (B-15)
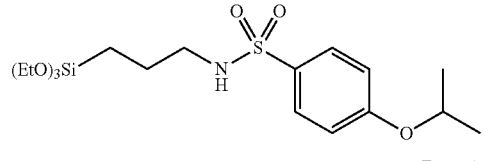
Formula (B-16)
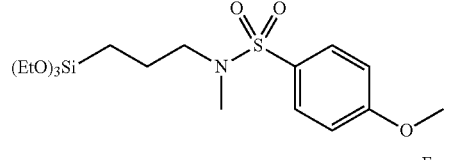
Formula (B-17)
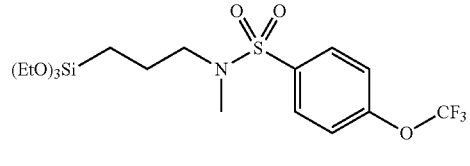

Formula (B-18)
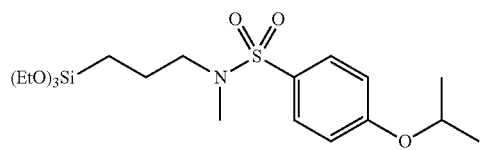
Formula (B-19)
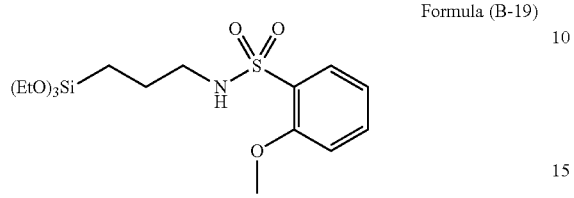
Formula (B-20)
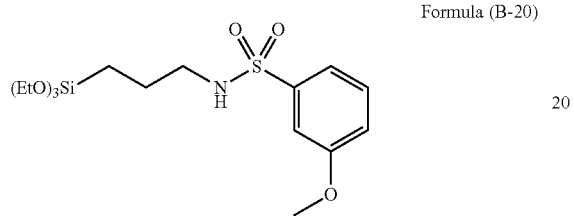
Formula (B-21)
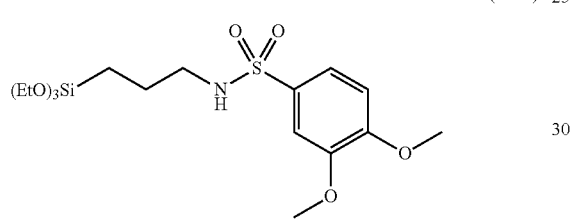
Formula (B-22)
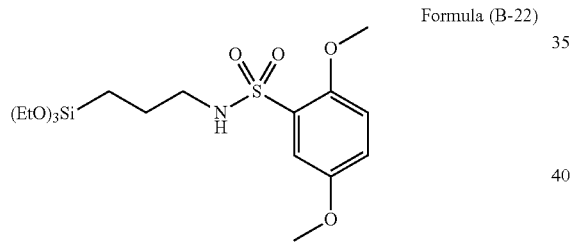
Formula (B-23)
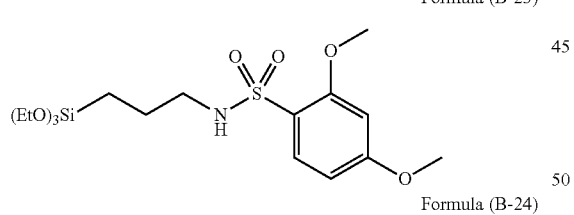
Formula (B-24)
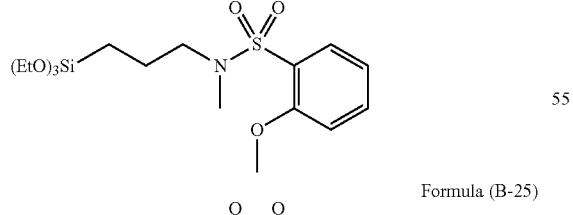
Formula (B-25)
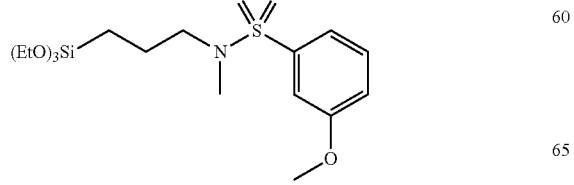
Formula (B-26)
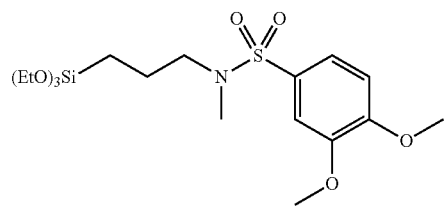
Formula (B-27)
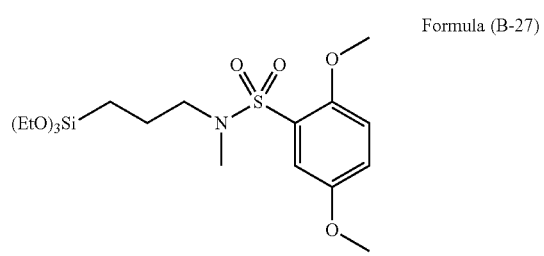
Formula (B-28)
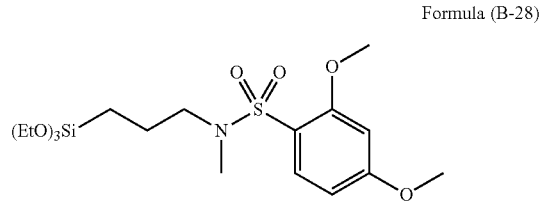
Formula (B-29)
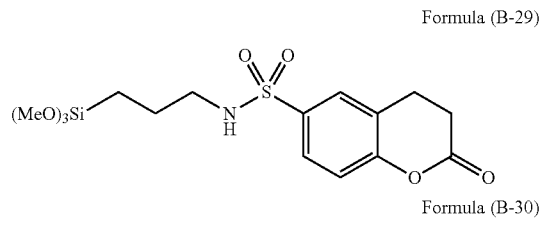
Formula (B-30)
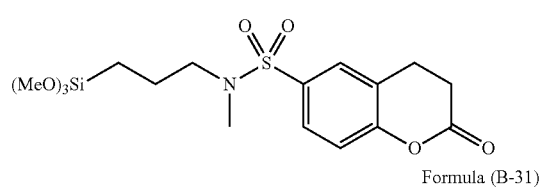
Formula (B-31)
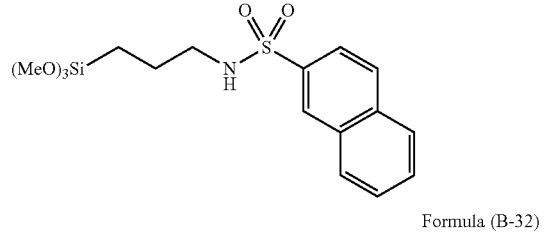
Formula (B-32)
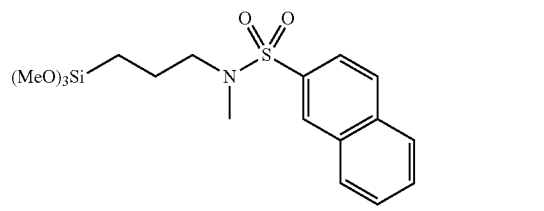

Formula (B-33)
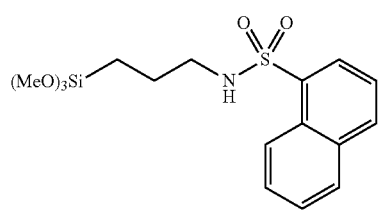
Formula (B-34)
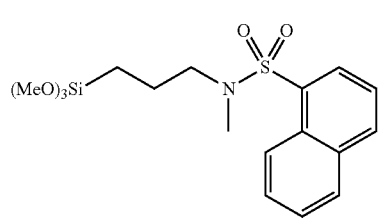
Formula (B-35)
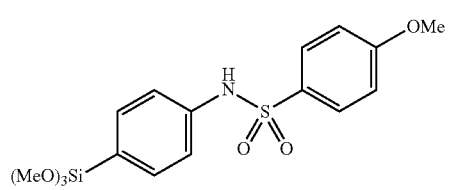
Formula (B-36)
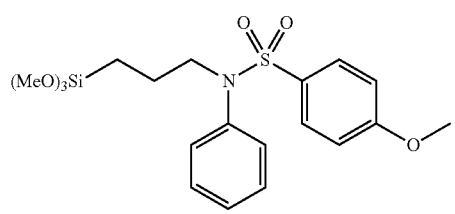
Specific examples of the hydrolysis-condensation product (polysiloxane) used in the present invention are illustrated below.
Formula (3-1)
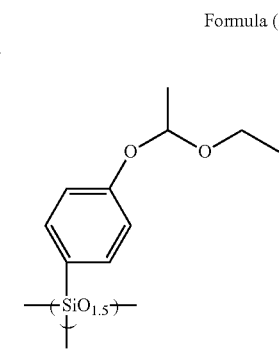
Formula (3-2)
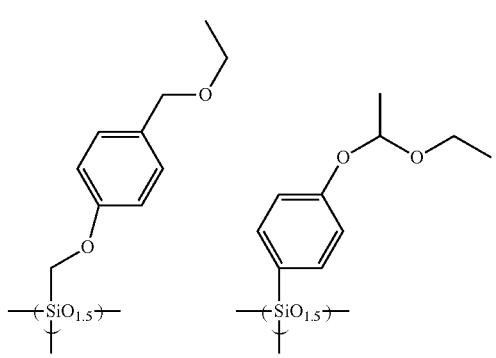
Formula (3-3)
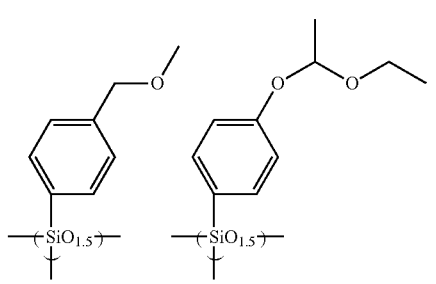
Formula (3-4)
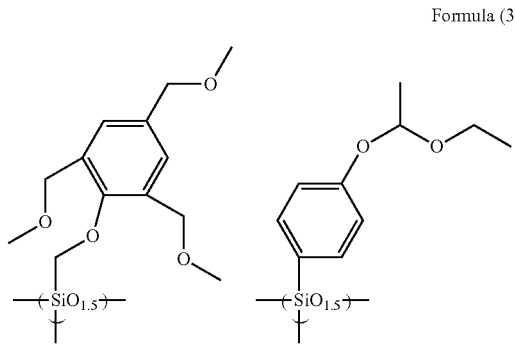
Formula (3-5)
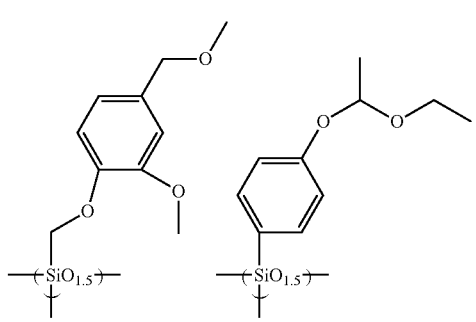
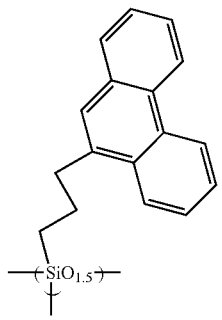

Formula (3-6)
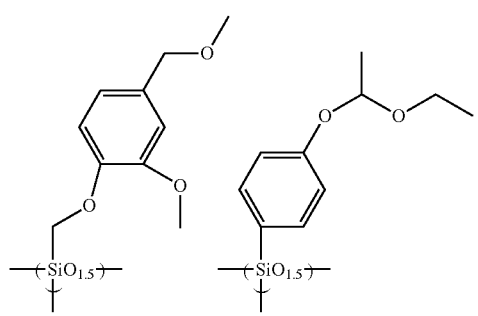
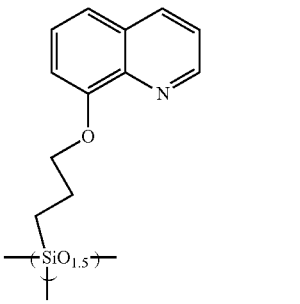
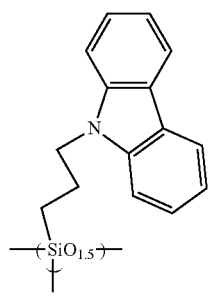
Formula (3-7)
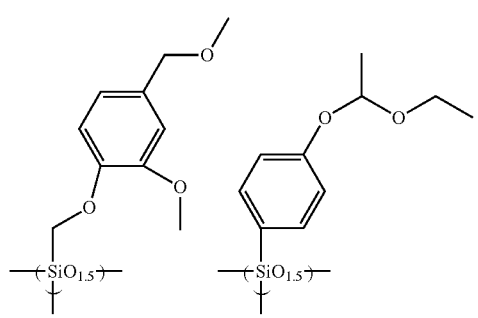
Formula (3-9)
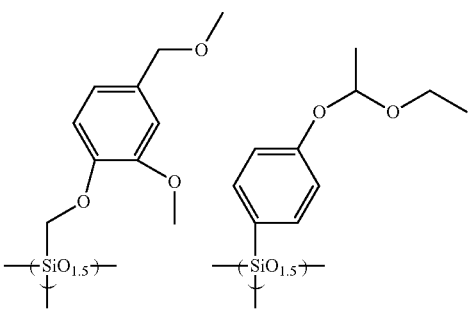
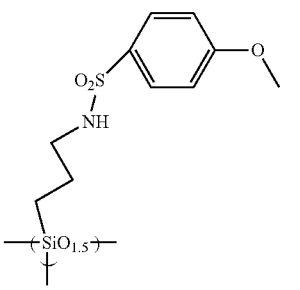
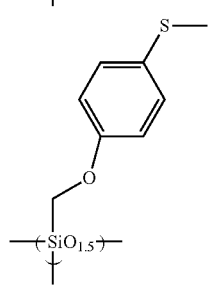
Formula (3-8)
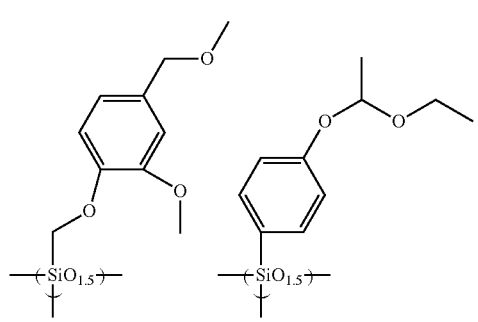
Formula (3-10)
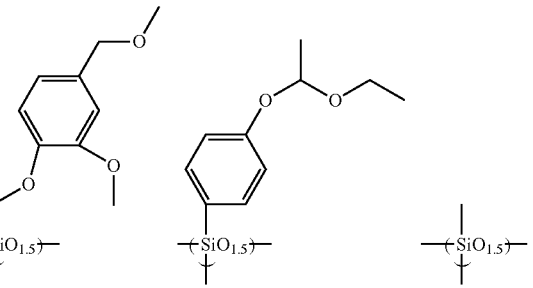
Formula (3-11)
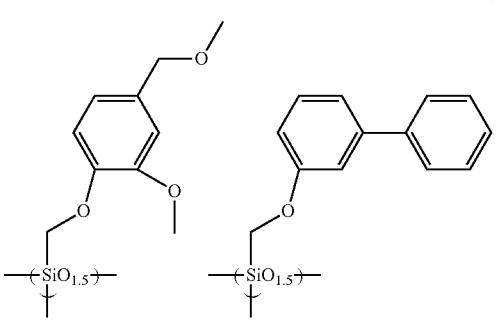

Formula (3-12)

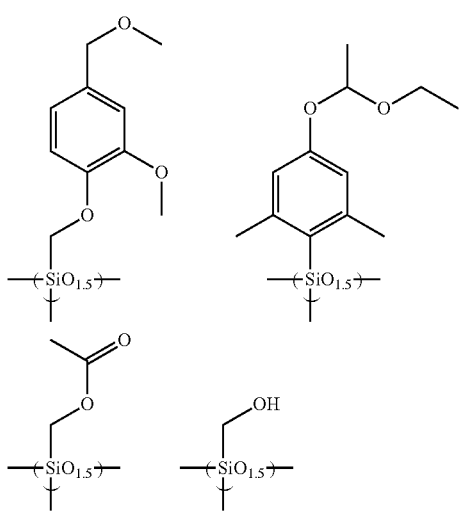

Formula (3-13)

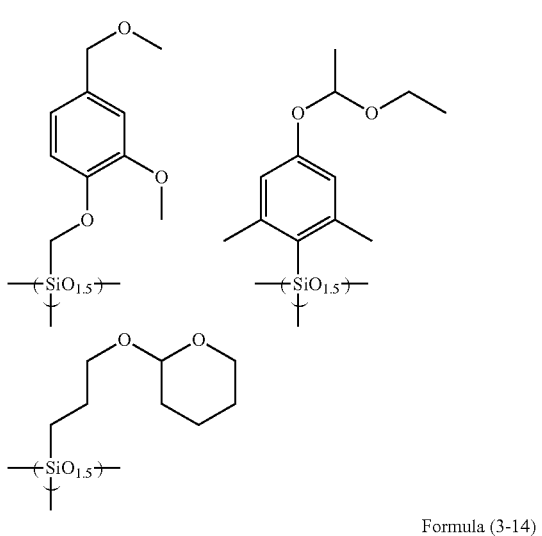

Formula (3-14)

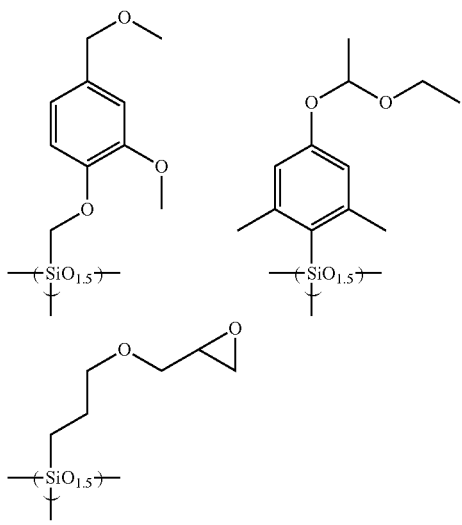

The hydrolysis-condensation product (polyorganosiloxane) of the hydrolyzable silane above is the condensation product having a weight average molecular weight of 1000 to 1000000, or 1000 to 100000. These molecular weights are molecular weights obtained in terms of polystyrene through GPC analysis.

The measurement conditions of GPC may include, for example, a GPC apparatus (trade name: HLC-8220GPC, manufactured by TOSOH CORPORATION), a GPC column (trade name: Shodex KF803L, KF802, KF801, manufactured by SHOWA DENKO K.K.), column temperature of 40° C., eluent (elution solvent) of tetrahydrofuran, flow rate (flow velocity) of 1.0 ml/min, and a standard sample of polystyrene (manufactured by SHOWA DENKO) K.K.).

In the hydrolysis of alkoxysilyl group, acyloxysilyl group, or halogenated silyl group, 0.5 to 100 moles, preferably, 1 to 10 moles of water is used per 1 mole of the hydrolyzable group.

Furthermore, 0.001 to 10 moles, preferably 0.001 to 1 mole of a hydrolysis catalyst can be used per 1 mole of the hydrolyzable group.

The reaction temperature in hydrolysis and condensation is usually 20 to 80° C.

The hydrolysis may be performed completely or may be performed partially. That is, a hydrolysis product or a monomer may be left in the hydrolysis-condensation product.

A catalyst may be used during hydrolysis and condensation.

Examples of the hydrolysis catalyst include metal chelate compounds, organic acids, inorganic acids, organic bases, and inorganic bases.

Examples of the metal chelate compound serving as a hydrolysis catalyst include titanium chelate compounds such as: triethoxy-mono(acetylacetonate)titanium, tri-n-propoxy-mono(acetylacetonate)titanium, tri-i-propoxy-mono(acetylacetonate)titanium, tri-n-butoxy-mono(acetylacetonate)titanium, tri-sec-butoxy-mono(acetylacetonate)titanium, tri-t-butoxy-mono(acetylacetonate)titanium, diethoxy-bis(acetylacetonate)titanium, di-n-propoxy-bis(acetylacetonate)titanium, di-i-propoxy-bis(acetylacetonate)titanium, di-n-butoxy-bis(acetylacetonate)titanium, di-sec-butoxy-bis(acetylacetonate)titanium, di-t-butoxy-bis(acetylacetonate)titanium, monoethoxy-tris(acetylacetonate)titanium, mono-n-propoxy-tris(acetylacetonate)titanium, mono-i-propoxy-tris(acetylacetonate)titanium, mono-n-butoxy-tris(acetylacetonate)titanium, mono-sec-butoxy-tris(acetylacetonate)titanium, mono-t-butoxy-tris(acetylacetonate)titanium, tetrakis(acetylacetonate)titanium, triethoxy-mono(ethylacetoacetate)titanium, tri-n-propoxy-mono(ethylacetoacetate)titanium, tri-i-propoxy-mono(ethylacetoacetate)titanium, tri-n-butoxy-mono(ethylacetoacetate)titanium, tri-sec-butoxy-mono(ethylacetoacetate)titanium, tri-t-butoxy-mono(ethylacetoacetate)titanium, diethoxy-bis(ethylacetoacetate)titanium, di-n-propoxy-bis(ethylacetoacetate)titanium, di-1-propoxy-bis(ethylacetoacetate)titanium, di-n-butoxy-bis(ethylacetoacetate)titanium, di-sec-butoxy-bis(ethylacetoacetate)titanium, di-t-butoxy-bis(ethylacetoacetate)titanium, monoethoxy-tris(ethylacetoacetate)titanium, mono-n-propoxy-tris(ethylacetoacetate)titanium, mono-1-propoxy-tris(ethylacetoacetate)titanium, mono-n-butoxy-tris(ethylacetoacetate)titanium, mono-sec-butoxy-tris(ethylacetoacetate)titanium, mono-t-butoxy-tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as: triethoxy-mono(acetylacetonate)zirconium, tri-n- propoxy-mono(acetylacetonate)zirconium, tri-i-propoxy-mono(acetylacetonate)zirconium, tri-n-butoxy-mono(acetylacetonate)zirconium, tri-sec-butoxy-mono(acetylacetonate)zirconium, tri-t-butoxy-mono(acetylacetonate)zirconium, diethoxy-bis(acetylacetonate)zirconium, di-n-propoxy-bis(acetylacetonate)zirconium, di-i-propoxy-bis(acetylacetonate)zirconium, di-n-butoxy-bis(acetylacetonate)zirconium, di-sec-butoxy-bis(acetylacetonate)zirconium, di-t-butoxy-bis(acetylacetonate)zirconium, monoethoxy-tris(acetylacetonate)zirconium, mono-n-propoxy-tris(acetylacetonate)zirconium, mono-i-propoxy-tris(acetylacetonate)zirconium, mono-n-butoxy-tris(acetylacetonate)zirconium, mono-sec-butoxy-tris(acetylacetonate)zirconium, mono-t-butoxy-tris(acetylacetonate)zirconium, tetrakis(acetylacetonate)zirconium, triethoxy-mono(ethylacetoacetate)zirconium, tri-n-propoxy-mono(ethylacetoacetate)zirconium, tri-i-propoxy-mono(ethylacetoacetate)zirconium, tri-n-butoxy-mono(ethylacetoacetate)zirconium, tri-sec-butoxy-mono(ethylacetoacetate)zirconium, tri-t-butoxy-mono(ethylacetoacetate)zirconium, diethoxy-bis(ethylacetoacetate)zirconium, di-n-propoxy-bis(ethylacetoacetate)zirconium, di-i-propoxy-bis(ethylacetoacetate)zirconium, di-n-butoxy-bis(ethylacetoacetate)zirconium, di-sec-butoxy-bis(ethylacetoacetate)zirconium, di-t-butoxy-bis(ethylacetoacetate)zirconium, monoethoxy-tris(ethylacetoacetate)zirconium, mono-n-propoxy-tris(ethylacetoacetate)zirconium, mono-i-propoxy-tris(ethylacetoacetate)zirconium, mono-n-butoxy-tris(ethylacetoacetate)zirconium, mono-sec-butoxy-tris(ethylacetoacetate)zirconium, mono-t-butoxy-tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and
aluminum chelate compounds such as:
tris(acetylacetonate)aluminum and tris(ethylacetoacetate)aluminum.

Examples of the organic acid serving as a hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifloroacetic acid, formic acid, malonic acid, sulfonic acids, phthalic acid, fumaric acid, citric acid, and tartaric acid.

Examples of the inorganic acid serving as a hydrolysis catalyst include hydrochloric acid, nitric acid, sulfuric acid, hydrofluoric acid, and phosphoric acid.

Examples of the organic base serving as a hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, trimethylphenylammonium hydroxide, benzyltrimethylammonium hydroxide, and benzyltriethylammonium hydroxide.

Examples of the inorganic base include ammonia, sodium hydroxide, potassium hydroxide, barium hydroxide, and calcium hydroxide. Among these catalysts, metal chelate compounds, organic acids, and inorganic acids are preferred, and they may be used singly or in combination of two or more at the same time.

Examples of the organic solvent used in hydrolysis include aliphatic hydrocarbon-based solvents such as:
n-pentane, i-pentane, n-hexane, i-hexane, n-heptane, i-heptane, 2,2,4-trimethylpentane, n-octane, i-octane, cyclohexane, and methylcyclohexane;
aromatic hydrocarbon-based solvents such as:
benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene;
monoalcohol-based solvents such as:
methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzil alcohol, phenylmethylcarbinol, diacetone alcohol, and cresol;
polyalcohol-based solvents such as:
ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerol;
ketone-based solvents such as:
acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone;
ether-based solvents such as:
ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether; dipropylene glycol monobutyl ether, tripropylene glycol monomethyl ether, tetrahydrofuran, and
2-methyltetrahydrofuran;
ester-based solvents such as:
diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate;

nitrogen-containing solvents such as:
N-methylformamide, N,N-dimethylformamide, N,N-diethylformamide, acetamide, N-methylacetamide, N,N-dimethylacetamide. N-methylpropionamide, and N-methylpyrrolidone; and sulfur-containing solvents such as:
dimethyl sulfide, diethyl sulfide, thiophene, tetrahydrothiophene, dimethylsulfoxide, sulfolane, and 1,3-propane sultone. These solvents may be used singly or in combination of two or more.

In particular, ketone-based solvents such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone are preferred in terms of storage stability of the solution.

Bisphenol S or a bisphenol S derivative may be added as an additive. The amount of bisphenol S or a bisphenol S derivative is 0.01 to 20 parts by mass, or 0.01 to 10 parts by mass, or 0.01 to 5 parts by mass with respect to 100 parts by mass of polyorganosiloxane.

Examples of preferable bisphenol S or a bisphenol S derivative are illustrated below.

Formula (C-1)

Formula (C-2)

Formula (C-3)

Formula (C-4)

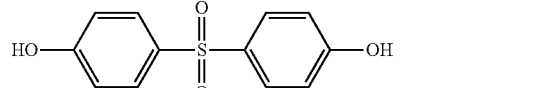

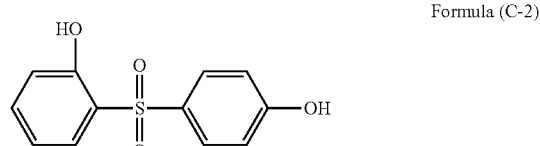

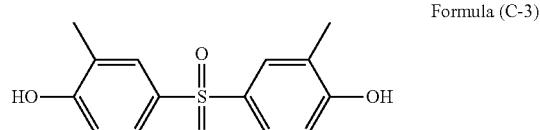

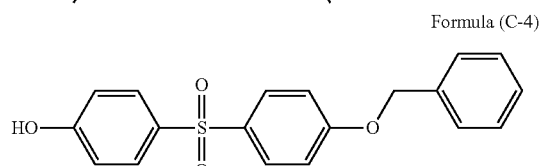

-continued

Formula (C-5)

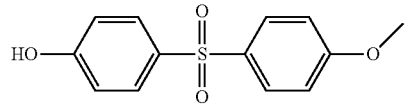

Formula (C-6)

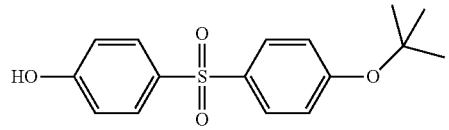

Formula (C-7)

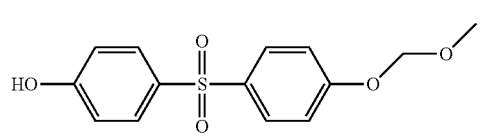

Formula (C-8)

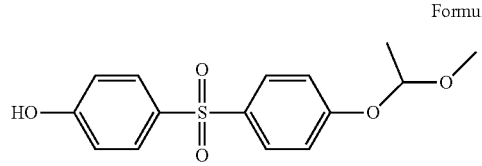

Formula (C-9)

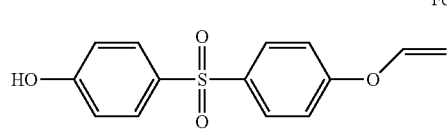

Formula (C-10)

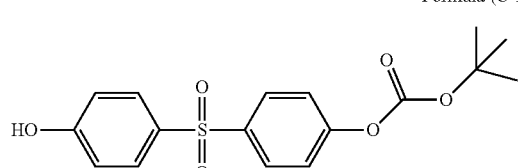

Formula (C-11)

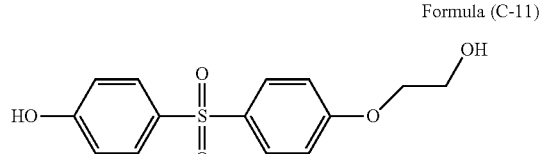

Formula (C-12)

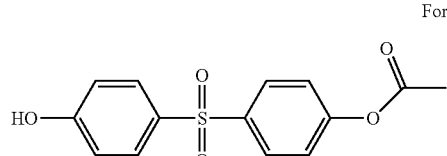

Formula (C-13)

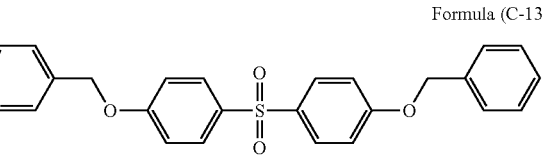

Formula (C-14)

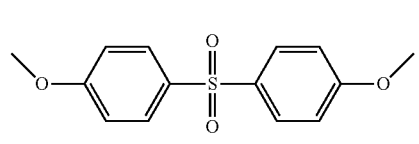

-continued

Formula (C-15)
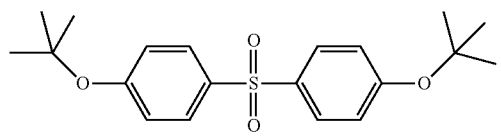

Formula (C-16)
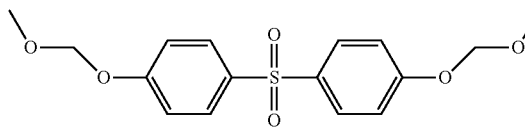

Formula (C-17)
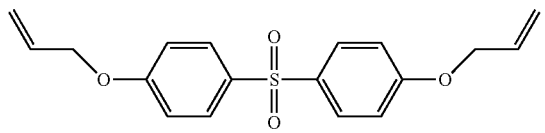

Formula (C-18)
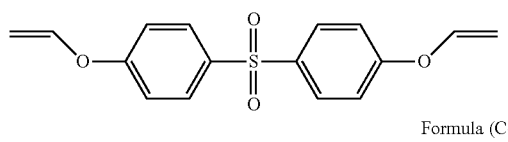

Formula (C-19)
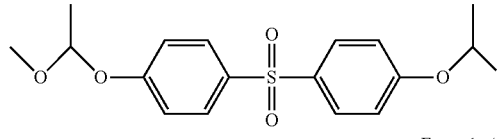

Formula (C-20)
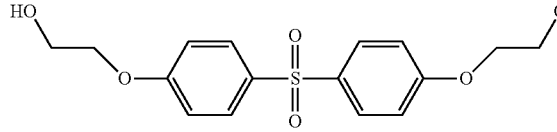

Formula (C-21)
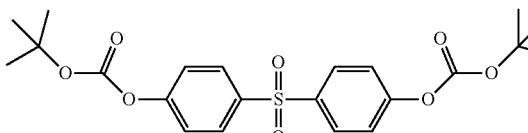

Formula (C-22)
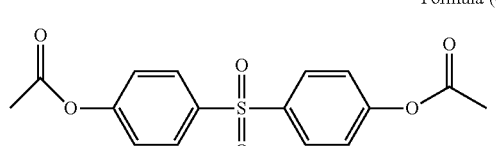

Formula (C-23)
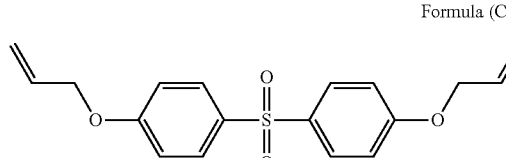

The film-forming composition of the present invention may contain a curing catalyst. The curing catalyst acts as a curing catalyst when a coating film containing polyorganosiloxane composed of a hydrolysis-condensation product is heated and cured.

For example, ammonium salts, phosphines, phosphonium salts, or sulfonium salts may be used as the curing catalyst.

Examples of the ammonium salts include a quaternary ammonium salt having a structure of Formula (D-1):

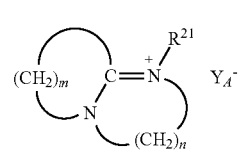

Formula (D-1)

(where m is an integer of 2 to 11, n is an integer of 2 to 3, $R^{21}$ is an alkyl group or an aryl group, and $Y_A^-$ is a negative ion), a quaternary ammonium salt having a structure of Formula (D-2):

$$R^{22}R^{23}R^{24}R^{25}N^+Y_A^-$$  Formula (D-2)

(where each of $R^{12}$, $R^{23}$, $R^{24}$ and $R^{25}$ is an alkyl group or an aryl group, N is a nitrogen atom, $Y_A^-$ is a negative ion, and $R^{22}$, $R^{23}$, $R^{24}$, and $R^{25}$ are each bonded to a nitrogen atom through a C—N bond), a quaternary ammonium salt having a structure of Formula (D-3):

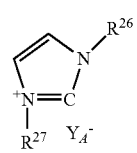

Formula (D-3)

(where each of $R^{26}$ and $R^{27}$ is an alkyl group or an aryl group, and $Y_A^-$ is a negative ion), a quaternary ammonium salt having a structure of Formula (D-4);

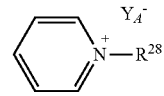

Formula (D-4)

(where $R^{28}$ is an alkyl group or an aryl group, and $Y_A^-$ is a negative ion), a quaternary ammonium salt having a structure of Formula (D-5):

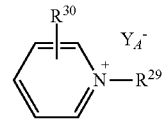

Formula (D-5)

(where each of $R^{29}$ and $R^{30}$ is an alkyl group or an aryl group, and $Y_A^-$ is a negative ion), and a tertiary ammonium salt having a structure of Formula (D-6):

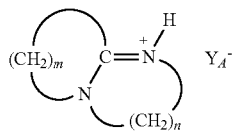

Formula (D-6)

(where m is an integer of 2 to 11, n is an integer of 2 to 3, H is a hydrogen atom, and $Y_A^-$ is a negative ion).

Examples of the phosphonium salts include a quaternary phosphonium salt of Formula (D-7):

$$R^{31}R^{32}R^{33}R^{34}P^+Y_A^-$$ Formula (D-7)

(where each of $R^{31}$, $R^{32}$, $R^{33}$, and $R^{34}$ is an alkyl group or an aryl group, P is a phosphorus atom, $Y_A$ is a negative ion, and $R^{31}$, $R^{32}$, $R^{33}$, and $R^{34}$ are each bonded to a phosphorus atom through a C—P bond).

Examples of the sulfonium salts include a tertiary sulfonium salt having a structure of Formula (D-8):

$$R^{35}R^{36}R^{37}S^+Y_A^-$$ Formula (D-8)

(where each of $R^{35}$, $R^{36}$, and $R^{37}$ is an alkyl group or an aryl group, S is a sulfur atom, $Y_A^-$ is a negative ion, and $R^{35}$, $R^{36}$, and $R^{37}$ are each bonded to a sulfur atom through a C—S bond).

The compound of Formula (D-1) above is a quaternary ammonium salt derived from amine, where m is an integer of 2 to 11, and n is an integer of 2 to 3. $R^{21}$ of this quaternary ammonium salt is a $C_{1-18}$, preferably $C_{2-10}$ alkyl group or aryl group, and examples include linear alkyl groups such as ethyl group, propyl group, and butyl group, benzyl group, cyclohexyl group, cyclohexylmethyl group, and dicyclopentadienyl group. Examples of the negative ion ($Y_A^-$) include halogen ions such as chlorine ion ($Cl^-$), bromine ion ($Br^-$), and iodine ion ($I^-$), and acid groups such as carboxylate (—$COO^-$), sulfonate (—$SO_3^-$), and alcoholate (—$O^-$).

The compound of Formula (D-2) above is a quaternary ammonium salt represented as $R^{22}R^{23}R^{24}R^{25}N^+Y_A^-$. $R^{22}$, $R^{23}$, $R^{24}$, and $R^{25}$ of this quaternary ammonium salt are a $C_{1-18}$ alkyl group or aryl group, or a silane compound bonded to a silicon atom through a Si—C bond. Examples of the negative ion ($Y_A^-$) include halogen ions such as chlorine ion ($Cl^-$), bromine ion ($Br^-$), and iodine ion ($I^-$), and acid groups such as carboxylate (—$COO^-$), sulfonate (—$SO_3^-$), and alcoholate (—$O^-$). This quaternary ammonium salt is commercially available, and examples include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) above is a quaternary ammonium salt derived from 1-substituted imidazole, $R^{26}$ and $R^{27}$ are a $C_{1-18}$ alkyl group or aryl group, and the total carbon number of $R^{26}$ and $R^{27}$ is preferably 7 or more. For example, $R^{26}$ may be a methyl group, an ethyl group, a propyl group, a phenyl group, or a benzyl group, and $R^{27}$ may be a benzyl group, an octyl group, or an octadecyl group. Examples of the negative ion ($Y_A^-$) include halogen ions such as chlorine ion ($Cl^-$), bromine ion ($Br^-$), iodine ion ($I^-$), and acid groups such as carboxylate (—$COO^-$), sulfonate (—$SO_3^-$), and alcoholate (—$O^-$). This compound may be commercially obtained or may be produced, for example, by reacting an imidazole-based compound such as 1-methylimidazole and 1-benzylimidazole with a halogenated alkyl or a halogenated aryl such as benzyl bromide and methyl bromide.

The compound of Formula (D-4) above is a quaternary ammonium salt derived from pyridine, $R^{21}$ is a $C_{1-18}$, preferably $C_{4-18}$ alkyl group or aryl group, and examples thereof include butyl group, octyl group, benzyl group, and lauryl group. Examples of the negative ion ($Y_A^-$) include halogen ions such as chlorine ion ($Cl^-$), bromine ion ($Br^-$), and iodine ion ($I^-$), and acid groups such as carboxylate (—$COO^-$), sulfonate (—$SO_3^-$), and alcoholate (—$O^-$). This compound may be commercially obtained or may be produced, for example, by reacting pyridine with a halogenated alkyl or a halogenated aryl such as lauryl chloride, benzyl chloride, benzyl bromide, methyl bromide, and octyl bromide. Examples of the compound may include N-laurylpyridinium chloride and N-benzylpyridinium bromide.

The compound of Formula (D-5) above is a quaternary ammonium salt derived from a substituted pyridine such as picoline, $R^{29}$ is a $C_{1-18}$, preferably $_{4-18}$ alkyl group or aryl group, and examples thereof include methyl group, octyl group, lauryl group, and benzyl group. $R^{30}$ is a $C_{1-18}$ alkyl group or aryl group. For example, in the case of a quaternary ammonium derived from picoline, $R^{30}$ is a methyl group. Examples of the negative ion ($Y_A^-$) include halogen ions such as chlorine ion ($Cl^-$), bromine ion ($Br^-$), and iodine ion ($I^-$), and acid groups such as carboxylate (—$COO^-$), sulfonate (—$SO_3^-$), and alcoholate (—$O^-$). This compound may be commercially obtained or may be produced, for example, by reacting a substituted pyridine such as picoline with a halogenated alkyl or a halogenated aryl such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of Formula (D-6) above is a tertiary ammonium salt derived from amine, where m is an integer of 2 to 11 and n is an integer of 2 to 3. Examples of the negative ion ($Y_A^-$) include halogen ions such as chlorine ion ($Cl^-$), bromine ion ($Br^-$), and iodine ion ($I^-$), and acid groups such as carboxylate (—$COO^-$), sulfonate (—$SO_3^-$), and alcoholate (—$O^-$). The compound may be produced by a reaction of amine with weak acid such as carboxylic acid and phenol. Examples of the carboxylic acid include formic acid and acetic acid. When formic acid is used, the negative ion ($Y_A^-$) is ($HCOO^-$). When acetic acid is used, the negative ion ($Y_A^-$) is ($CH_3COO^-$). When phenol is used, the negative ion ($Y_A^-$) is ($C_6H_5O^-$).

The compound of Formula (D-7) above is a quaternary phosphonium salt having a structure of $R^{32}R^{33}R^{34}P^+Y_A^-$. Each of $R^{31}$, $R^{32}$, $R^{33}$, and $R^{34}$ is a $C_{1-18}$ alkyl group or aryl group, or a silane compound bonded to a silicon atom through a Si—C bond. Preferably, three of four substituents in $R^{31}$ to $R^{34}$ are phenyl groups or substituted phenyl groups, for example, phenyl groups or tolyl groups, and the remaining one is a $C_{1-18}$ alkyl group, aryl group, or a silane compound bonded to a silicon atom through a Si—C bond. Examples of the negative ion ($Y_A^-$) include halogen ions such as chlorine ion ($Cl^-$), bromine ion ($Br^-$), iodine ion ($I^-$), and acid groups such as carboxylate (—$COO^-$), sulfonate (—$SO_3^-$), and alcoholate (—$O^-$). This compound is commercially available, and examples thereof include halogenated tetraalkylphosphoniums such as halogenated tetra-n-butylphosphonium and halogenated tetra-n-propylphosphonium, halogenated trialkylbenzylphosphoniums such as halogenated triethylbenzylphosphonium, halogenated triphenylmonoalkylphosphoniums such as halogenated triphenylmethylphosphonium and halogenated triphenylethylphosphonium, halogenated triphenylbenzylphospsphoniums, halogenated tetraphenylphosphoniums, halogenated tritolylmonoarylphosphoniums, and halogenated tritolylmonoalkylphosphoniumns (where the halogen atom is a chlorine atom or a bromine atom). In particular, halogenated triphenylmonoalkylphosphoniumns such as halogenated triphenylmethylphosphonium and halogenated triphenylethylphosphonium, halogenated triphenylmonoarylphosphoniums such as halogenated triphenylbenzylphosphonium, halogenated tritolylmonoarylphosphoniums such as halogenated tritolylmonophenylphosphonium, and halogenated tritolylmonoalkylphosphoniums such as halogenated tritolylmonomethylphosphonium (where the halogen atom is a chlorine atom or a bromine atom) are preferable.

Examples of the phosphines include primary phosphines such as methylphosphine, ethylphosphine, propylphosphine, isopropylphosphine, isobutylphosphine, and phenylphosphine, secondary phosphines such as dimethylphosphine, diethylphosphine, diisopropylphosphine, diisoamylphosphine, and diphenylphosphine, and tertiary phosphines such as trimethylphosphine, triethylphosphine, triphenylphosphine, methyldiphenylphosphine, and dimethylphenylphosphine.

The compound of Formula (D-8) above is a tertiary sulfonium salt having a structure of $R^{35}R^{36}R^{37}S^+Y_A^-$. $R^{35}$, $R^{36}$, and $R^{37}$ are a $C_{1-18}$ alkyl group or aryl group, or a silane compound bonded to a silicon atom through a Si—C bond. Preferably, three of four substituents in $R^{35}$ to $R^{37}$ are phenyl groups or substituted phenyl groups, such as phenyl groups or tolyl groups, and the remaining one is a $C_{1-18}$ alkyl group or aryl group. Examples of the negative ion ($Y_A^-$) include halogen ions such as chlorine ion (Cl$^-$), bromine ion (Br$^-$), and iodine ion (I$^-$), and acid groups such as carboxylate (—COO$^-$), sulfonate (—SO$_3^-$), alcoholate (—O$^-$), maleic acid anion, and nitric acid anion. The compound is commercially available, and examples thereof include halogenated tetraalkylsulfoniums such as halogenated tri-n-butylsulfonium, halogenated tri-n-propylsulfonium, halogenated trialkylbenzylsulfoniums such as halogenated diethylbenzylsulfonium, halogenated diphenylmonoalkylsulfoniums such as halogenated diphenylmethylsulfonium and halogenated diphenylethylsulfinium, halogenated triphenylsulfoniums (where the halogen atom is a chlorine atom or a bromine atom), tetraalkylphosphonium carboxylates such as tri-n-butylsulfonium carboxylate and tri-n-propylsulfonium carboxylate, trialkylbenzylsulfonium carboxylates such as diethylbenzylsulfonium carboxylate, diphenylmonoalkylsulfonium carboxylates such as diphenylmethylsulfonium carboxylate and diphenylethylsulfonium carboxylate, and triphenylsulfonium carboxylates. Halogenated triphenylsulfonium and triphenylsulfonium carboxylate can preferably be used.

In the present invention, a nitrogen-containing silane compound can be added as a curing catalyst. Examples of the nitrogen-containing silane compound include imidazole ring-containing silane compounds such as N-(3-triethoxysilylpropyl)-4,5-dihydroimidazole.

The amount of the curing catalyst is 0.01 to 10 parts by mass, or 0.01 to 5 parts by mass, or 0.01 to 3 parts by mass with respect to 100 parts by mass of polyorganosiloxane.

The hydrolysis-condensation product (polymer) obtained by hydrolyzing and condensing the hydrolyzable silane in a solvent using a catalyst can be subjected to reduced-pressure distillation to simultaneously remove the by-product alcohol, the used hydrolysis catalyst, and water. The acid or base catalyst used in the hydrolysis can be removed through neutralization or ion exchange. An organic acid, water, alcohol, or a combination thereof can be added to the film-forming composition of the present invention in order to stabilize the film-forming composition including the hydrolysis-condensation product.

Examples of the organic acid above include oxalic acid, malonic acid, methylmalonic acid, succinic acid, maleic acid, malic acid, tartaric acid, phthalic acid, citric acid, glutaric acid, citric acid, lactic acid, and salicylic acid. Among those, preferable examples include oxalic acid and maleic acid. The amount of the organic acid added is 0.1 to 5.0 parts by mass with respect to 100 parts by mass of the condensation product (polyorganosiloxane). The water added may be pure water, ultrapure water, ion exchange water, and the like, and the amount added can be 1 to 20 parts by mass with respect to 100 parts by mass of the film-forming composition.

The alcohol added is preferably the one easily evaporated by heating after the application, and examples thereof include methanol, ethanol, propanol, isopropanol, and butanol. The amount of alcohol added can be 1 to 20 parts by mass with respect to 100 parts by mass of the film-forming composition.

The film-forming composition of the present invention can include, in addition to the components above, an organic polymer compound, a photoacid generator, a surfactant, and the like, as necessary.

The organic polymer compound is not limited to a particular compound, and various kinds of organic polymers may be used. A condensation polymer, an addition polymer, and the like can be used. An addition polymer and a condensation polymer such as polyester, polystyrene, polyimide, acrylic polymer, methacrylic polymer, polyvinyl ether, phenol novolac, naphthol novolac, polyether, polyamide, and polycarbonate can be used. An organic polymer having an aromatic ring structure such as benzene ring, naphthalene ring, anthracene ring, triazine ring, quinoline ring, and quinoxaline ring functioning as a light-absorbing moiety is preferably used.

Examples of such an organic polymer compound include addition polymers including addition polymerizable monomers as its structural unit, such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide, and condensation polymers such as phenol novolac and naphthol novolac.

When an addition polymer is used as the organic polymer compound, the polymer compound may be a homopolymer or may be a copolymer. In production of the addition polymer, an addition polymerizable monomer is used. Examples of such an addition polymerizable monomer include acrylic acids, methacrylic acids, acrylic acid ester compounds, methacrylic acid ester compounds, acrylamide compounds, methacrylamide compounds, vinyl compounds, styrene compounds, maleimide compounds, maleic anhydrides, and acrylonitrile.

Examples of the acrylic acid ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate. 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinyl acetate, vinyltrimethoxysilane, 2-chloroethyl vinyl ether, 2-methoxyethyl vinyl ether, vinylnaphthalene, and vinylanthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylrnaleimide, N-cyclohexylmaleimide, N-benzylmaleimide, and N-hydroxyethylmaleimide.

When a condensation polymer is used as the polymer, examples of such a polymer include a condensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Other examples include polyesters, polyamides, and polyimides such as polypyromellitimide, poly(p-phenylene terephthalamide), polybutylene terephthalate, and polyethylene terephthalate.

When the organic polymer compound contains hydroxy group, this hydroxy group can form a cross-linking reaction with polyorganosiloxane.

As the organic polymer compound, a polymer compound having a weight average molecular weight of, for example, 1000 to 1000000, or 3000 to 300000, or 5000 to 200000, or 10000 to 100000 can be used.

The organic polymer compounds may be used singly or may be used in combination of two or more.

When the organic polymer compound is used, the amount of the organic polymer compound is 1 to 200 parts by mass, or 5 to 100 parts by mass, or 10 to 50 parts by mass, or 20 to 30 parts by mass with respect to 100 parts by mass of the condensation product (polyorganosiloxane).

The film-forming composition of the present invention may contain an acid generator.

Examples of the acid generator include thermal acid generators and photoacid generators.

Examples of the photoacid generator included in the film-forming composition of the present invention include onium salt compounds, sulfonimide compounds, and disulfonyl diazomethane compounds.

Examples of the onium salt compound include iodonium salt compounds such as diphenyliodonium hexafluorophosphate, diphenyliodonium trifluorornethanesulfonate, diphenyliodonium nonafluoro normalbutanesulfonate, diphenyliodonium perfluoro normaloctanesulfonate, diphenyliodonium camphorsulfonate, bis(4-tert-butylphenyl)iodonium camphorsulfonate, and bis(4-tert-butylphenyl)iodonium trifluoromethanesulfonate, and sulfonium salt compounds such as triphenylsulfonium hexafluoroantimonate, triphenylsulfonium nonafluoro normalbutanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro normal butanesulfonyloxy)succinimide, N-(camphorsulfonyloxy)succinimide, and N-(trifluoromethanesulfonyloxy) naphthalimide.

Examples of the disulfonyl diazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photoacid generators may be used singly or may be used in combination of two or more.

When a photoacid generator is used, the amount of the photoacid generator is 0.01 to 5 parts by mass, or 0.1 to 3 parts by mass, or 0.5 to 1 part by mass with respect to 100 parts by mass of the condensation product (polyorganosiloxane).

The surfactant is effective for suppressing pinholes, striation, and the like when the film-forming composition of the present invention is applied on a substrate as the resist underlayer film-forming composition for lithography.

Examples of the surfactant included in the film-forming composition of the present invention include polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octylphenol ether, and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, nonionic surfactants such as polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine-based surfactants such as trade name: iFTOP EF301, EF303, EF352 (manufactured by Tobhkem Products Corp.), trade name: MEGAFACE F171, F173, R-08, R-30, R-30N, R-40LM (manufactured by DIC Corporation), Fluorad FC430, FC431 (manufactured by Sumitomo 3M Limited), trade name: AsahiGuard AG710, Surtlon S-382, SC101, SC102, SC103, SC104, SC105, SC106 (manufactured by Asahi Glass Co., Ltd.), and organosiloxane polymer KP341 (manufactured by Shin-Etsu Chemical Co., Ltd.). These surfactants may be used singly or may be used in combination of two or more. When a surfactant is used, the amount of the surfactant is 0.0001 to 5 parts by mass, or 0.001 to 1 part by mass, or 0.01 to 1 part by mass with respect to 100 parts by mass of the condensation product (polyorganosiloxane).

A rheology controlling agent, an adhesion assistant, and the like may further be added to the film-forming composition of the present invention. The rheology controlling agent is effective for improving the fluidity of the film-forming composition. The adhesion assistant is effective for improving the adhesion between the semiconductor substrate or the resist and the underlayer film.

The solvent used in the film-forming composition of the present invention may be any solvent that can dissolve the solid contents above. Examples of such a solvent include methyl cellosolve acetate, ethyl cellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxy propionate, ethyl 2-hydroxy-2-methyl propionate, ethyl ethoxy acetate, ethyl hydroxy acetate, methyl 2-hydroxy-3-methylbutanoate, methyl 3-methoxy propionate, ethyl 3-methoxy propionate, ethyl 3-ethoxy propionate, methyl 3-ethoxy propionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methylpropyl ketone, methylbutyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used singly or may be used in combination of two or more.

In the present invention, the film-forming composition can be used as a resist underlayer film-forming composition for use in the lithography process.

A resist underlayer film-forming composition including the film-forming composition of the present invention is applied on a substrate used in production of semiconductor devices (for example, a silicon wafer substrate, a silicon/silicon dioxide-coated substrate, a silicon nitride substrate, a glass substrate, an ITO substrate, a polyimide substrate, and a low dielectric constant material (low-k material)-coated substrate) by an appropriate coating method such as a spinner and a coater and is thereafter baked to form a resist underlayer film. The conditions of baking are appropriately selected from the baking temperature of 80° C. to 250° C. and the baking time of 0.3 to 60 minutes. Preferably, the baking temperature is 150° C. to 250° C. and the baking time is 0.5 to 2 minutes. The film thickness of the resist underlayer film formed in the present invention is, for example, 10 to 1000 nm, or 20 to 500 nm, or 50 to 300 nm, or 100 to 200 nm.

Subsequently, for example, a photoresist layer is formed on the resist underlayer film. The photoresist layer can be formed by a well-known method, that is, by applying a photoresist composition solution on the underlayer film and baking. The film thickness of the photoresist is, for example, 50 to 10000 nm, or 100 to 2000 nm, or 200 to 1000 nm.

In the present invention, after an organic underlayer film is formed on a substrate, the resist underlayer film of the present invention can be formed thereon and then covered with a photoresist. The pattern width of the photoresist is thus narrower, and the substrate can be processed by selecting an appropriate etching gas even when a thin photoresist is applied in order to prevent pattern collapse. For example, the resist underlayer film of the present invention can be processed using fluorine-based gas as an etching gas with a sufficiently high etching rate with respect to the photoresist. The organic underlayer film can be processed using oxygen-based gas as an etching gas with a sufficiently high etching rate with respect to the resist underlayer film of the present invention. Furthermore, the substrate can be processed using fluorine-based gas as an etching gas with a sufficiently high etching rate with respect to the organic underlayer film.

The photoresist formed on the resist underlayer film of the present invention is not limited to a particular one as long as photoresist is sensitive to light used for exposure. Either of a negative-type photoresist and a positive-type photoresist can be used. Examples of the photoresist include: a positive-type photoresist composed of a novolac resin and 1,2-naphthoquinone diazide sulfonic acid ester; a chemical amplification-type photoresist composed of a binder having a group decomposed by an acid to increase the alkali dissolving rate, and a photoacid generator; a chemical amplification-type photoresist composed of a low-molecular compound decomposed by an acid to increase the alkali dissolving rate of a photoresist, an alkali-soluble binder, and a photoacid generator; and a chemical amplification-type photoresist composed of a binder having a group decomposed by an acid to increase the alkali dissolving rate, a low-molecular compound decomposed by an acid to increase the alkali dissolving rate of a photoresist, and a photoacid generator. Examples of the photoresist include trade name: APEX-E manufactured by Shipley Company. L.L.C., trade name: PAR710 manufactured by Sumitomo Chemical Co., Ltd., and trade name: SEPR430 manufactured by Shin-Etsu Chemical Co., Ltd. The examples also include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, the exposure is performed through a predetermined mask. For the exposure, a Krf excimer laser (wavelength: 248 nm), an ArF excimer laser (wavelength: 193 nm), an F2 excimer laser (wavelength: 157 nm), and the like can be used. After the exposure, post exposure bake can also be performed, if necessary. The post exposure bake is performed under conditions appropriately selected from the baking temperature of 70° C. to 150° C. and the baking time of 0.3 to 10 minutes.

In the present invention, a resist for electron beam lithography or a resist for EUV lithography can be used as the resist, instead of the photoresist. As the electron beam resist, either of a positive type and a negative type can be used. Examples of the electron beam resist include: a chemical amplification-type resist composed of an acid generator and a binder having a group decomposed by an acid to change the alkali dissolving rate; a chemical amplification-type resist composed of an alkali-soluble binder, an acid generator, and a low-molecular compound decomposed by an acid to change the alkali dissolving rate of a resist; a chemical amplification-type resist composed of an acid generator, a binder having a group decomposed by an acid to change the alkali dissolving rate, and a low-molecular compound decomposed by an acid to change the alkali dissolving rate of a resist; a non-chemical amplification-type resist composed of a binder having a group decomposed by an electron beam to change the alkali dissolving rate; and a non-chemical amplification-type resist composed of a binder having a moiety broken by an electron beam to change the alkali dissolving rate. Also, in the case of using these electron beam resists, a resist pattern can be formed using an electron beam as the radiation source in the same manner as in the case of using a photoresist.

Examples of the EUV resist include methacrylate resin-based resists.

Subsequently, development is performed using a developer (for example, alkaline developer). By doing so, for example, when a positive photoresist is used, the photoresist of the exposed portion is removed, and the pattern of the photoresist is formed.

Examples of the developer include alkaline aqueous solutions such as: aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. In addition, a surfactant and the like may be added to these developers. The conditions for the development are selected appropriately from the temperature of 5 to 50° C. and the time of 10 to 600 seconds.

In the present invention, an organic solvent can be used as a developer. Development is performed using a developer (solvent) after exposure. By doing so, for example, when a positive photoresist is used, the photoresist of the unexposed portion is removed, and the pattern of the photoresist is formed.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. In addition, a surfactant and the like may be added to these developers. The development conditions are selected appropriately from the temperature of 5 to 50° C. and the time of 10 to 600 seconds.

Then, using the pattern of the thus formed photoresist (upper layer) as a protective film, the resist underlayer film of the present invention (intermediate layer) is removed, and then using the patterned film including the photoresist and the resist underlayer of the present invention (intermediate layer) as a protective film, the organic underlayer film (underlayer) is removed. Finally, using the patterned resist underlayer film of the present invention (intermediate layer) and the organic underlayer film (underlayer) as a protective film, the semiconductor substrate is processed.

First, the resist underlayer film of the present invention (intermediate layer) at the part where the photoresist is removed is removed by dry etching to expose the semiconductor substrate. In the dry etching of the resist underlayer film of the present invention, gas such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane and dichloroborane can be used. In the dry etching of the resist underlayer film, halogen-based gas is preferably used. In the dry etching using halogen-based gas, basically, a photoresist composed of an organic substance is less removed. By contrast, the resist underlayer film of the present invention including many silicon atoms is removed quickly by halogen-based gas. This can suppress reduction in film thickness of the photoresist due to the dry etching of the resist underlayer film. As a result, the photoresist can be used in the form of a thin film. The dry etching of the resist underlayer film is preferably performed using fluorine-based gas. Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

Subsequently, using the patterned film including the photoresist and the resist underlayer film of the present invention as a protective film, the organic underlayer film is removed. The organic underlayer film (underlayer) preferably undergoes dry etching using oxygen-based gas. This is because the resist underlayer film of the present invention including many silicon atoms is less removed by dry etching using oxygen-based gas.

Finally, the semiconductor substrate is processed. The semiconductor substrate is preferably processed by dry etching using fluorine-based gas.

Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

As the upper layer on the resist underlayer film of the present invention, an organic anti-reflective coating may be formed before formation of a photoresist. An anti-reflective coating composition used for the anti-reflective coating is not limited to a particular one, and may be appropriately selected from various anti-reflective coating compositions that have been commonly used for lithography process. The anti-reflective coating can be formed by a commonly used method, for example, coating with a spinner and a coater and baking.

The substrate coated with the resist underlayer film-forming composition composed of the film-forming composition of the present invention may have an organic or inorganic anti-reflective coating formed on the surface by CVD or the like, and the resist underlayer film of the present invention may be formed thereon.

The resist underlayer film formed of the resist underlayer film-forming composition of the present invention may have absorption of light depending on the wavelength of light used in the lithography process. In such a case, the resist underlayer film may function as an anti-reflective coating having the effect of preventing reflection light from the substrate. In addition, the resist underlayer film of the present invention may also be used as a layer for preventing interaction between the substrate and the photoresist, a layer having the function of preventing a material used for a photoresist or a substance produced at the time of exposing a photoresist to light from having an adverse effect on a substrate, a layer having the function of preventing diffusion of a substance generated from the substrate during heating and baking into the overlying photoresist, a barrier layer for reducing the poisoning effect of the photoresist layer by the semiconductor substrate dielectric layer, and the like.

The resist underlayer film formed of the resist underlayer film-forming composition of the present invention can be applied to a substrate having via holes used in the dual damascene process and can be used as a hole-filling material (filler) capable of filling the holes without vacancy. It can also be used as a planarizing material for planarizing the surface of an uneven semiconductor substrate.

As the underlayer film for the EUV resist, it can also be used for the following purposes in addition to the function as a hard mask. The resist underlayer film-forming composition can be used as an underlayer anti-reflective coating for the EUV resist that can prevent reflection of undesirable exposure light in EUV exposure (wavelength of 13.5 nm), for example, the above-noted UV or DUV (ArF light, KrF light), from the substrate or the interface, without intermixing with the EUV resist. The underlayer for the EUV resist can efficiently prevent reflection. In the case of using as an EUV resist underlayer film, the process can be performed in the same manner as the underlayer film for photoresist.

The present invention relates to a hydrolyzable silane of Formula (1').

$$R^1{}_a R^2{}_b Si(R^3)_{4-(a+b)}$$  Formula (1')

In Formula (1'), $R^1$ is an organic group of Formula (2') and is bonded to a silicon atom through a Si—C bond or a Si—O bond.

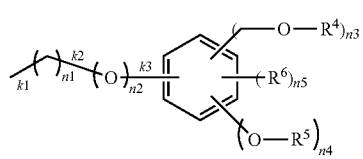  Formula (2')

$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof and is bonded to a silicon atom through a Si—C bond. $R^3$ is an alkoxy group, an acyloxy group, or a halogen group. Then, a is an integer of 1, b is an integer of 0 to 2, and a+b is an integer of 1 to 3.

In Formula (2'), $R^4$ is a hydrogen atom, a $C_{1-10}$ alkyl group, or an acyl group, $R^5$ is a hydrogen atom, a $C_{1-10}$ alkyl group, or a $C_{1-10}$ alkyl group having a $C_{1-10}$ alkoxy group, $R^6$ is a $C_{1-10}$ alkyl group, n1 is an integer of 0 to 10, n2 is an integer of 0 or 1, n3, n4, and n5 are integers, where n3 satisfies $1 \leq n3 \leq 5$, n4 satisfies $0 \leq n4 \leq 4$, and n5 satisfies $0 \leq n5 \leq 4$. Then, k1 is a bond end with a silicon atom when n1 is 1 to 10, k2 is a bond end with a silicon atom when n1 is 0 and n2 is 1, and k3 is a bond end with a silicon atom when n and n2 are 0.

In the k1 portion, the one bonded to a silicon atom can be selected.

Examples of the hydrolyzable silane compound of Formula (1') include the compounds of Formula (1-1), Formula (1-2), Formula (1-3), Formula (1-5), Formula (1-6), Formula (1-7), Formula (1-8), and Formula (1-10) above. Other examples include 4-(trimethoxysilyl)benzyl acetate and 4-(triethoxysilyl)benzyl acetate.

A compound in which n2 is an integer of 1 in Formula (1') can be exemplified.

EXAMPLES

Synthesis of Compound 1

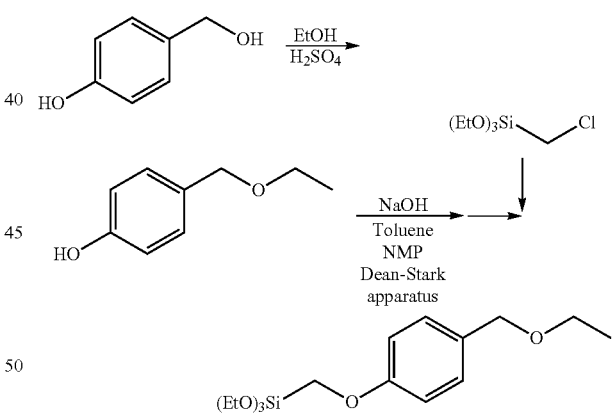

To a 1000-ml eggplant-shaped flask with a magnetic stirrer, 20.0 g of hydroxybenzyl alcohol and 400.0 g of ethanol were added and dissolved. To this solution, 0.32 g of concentrated sulfuric acid was added and heated for reflux for 20 hours. After the product was returned to room temperature and neutralized with sodium hydroxide, ethanol was removed by evaporation. The product was put into a 300-ml three-necked flask, to which 6.44 g of sodium hydroxide, 40 g of toluene, and 40 g of N-methylpyrrolidone (which may hereinafter be abbreviated as NMP) were added to allow a reaction to proceed for 4 hours while removing water and toluene in an oil bath at 130° C. Then, 34.28 g of chloromethyltriethoxysilane was added dropwise, and heating and stirring was performed at 130° C. for 4 hours. The resultant solution was returned to room temperature and put into a separating funnel, to which 120 g of toluene and 90 g of water were added to wash the organic phase. The washing was repeatedly performed three times. Next, the organic phase was dried with addition of magnesium sulfate and then filtered, and the solvent was removed by evaporation to yield a crude product. Subsequently, the crude product was purified by reduced-pressure distillation to yield 15 g of Compound 1 of interest.

$^1$H-NMR (500 MHz, DMSO-d$_6$): 1.13 ppm (t, 3H), 1.19 ppm (t, 9H), 3.43 ppm (q, 2H), 3.68 ppm (s, 2H), 3.86 ppm (q, 6H), 4.36 ppm (s, 2H), 6.95 ppm (d, 2H), 7.22 ppm (d, 2H)

Synthesis of Compound 2

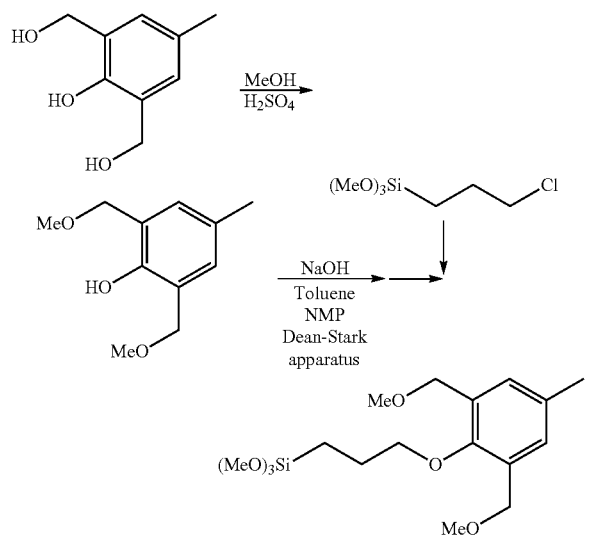

To a 1000-ml eggplant-shaped flask with a magnetic stirrer, 30.0 g of 2,6-bis(hydroxymethyl)-p-cresol and 600.0 g of methanol were added and dissolved. To this solution, 0.35 g of concentrated sulfuric acid was added and heated for reflux for 20 hours. After the solution was returned to room temperature and neutralized with sodium hydroxide, methanol was removed by evaporation. The product was put into a 300-ml three-necked flask, to which 7.13 g of sodium hydroxide, 60 g of toluene, and 60 g of NMP were added to allow a reaction to proceed for 4 hours while removing water and toluene in an oil bath at 130° C. Then, 35.54 g of 3-chloropropyltrimethoxysilane was added dropwise, and heating and stirring was performed at 130° C. for 4 hours. The resultant solution was returned to room temperature and put into a separating funnel, to which 120 g of toluene and 90 g of water were added to wash the organic phase. The washing was repeatedly performed three times. Next, the organic phase was dried with addition of magnesium sulfate and then filtered, and the solvent was removed by evaporation to yield a crude product. Subsequently, the crude product was purified by reduced-pressure distillation to yield 5 g of Compound 2 of interest.

$^1$H-NMR (500 MHz, DMSO-d$_6$): 0.70 ppm (t, 2H), 1.74 ppm (quin, 2H), 2.22 ppm (s, 3H), 3.27 ppm (s, 6H), 3.47 ppm (s, 9H), 3.67 ppm (t, 2H), 4.35 ppm (s, 4H), 7.07 ppm (s, 2H)

Synthesis of Compound 3

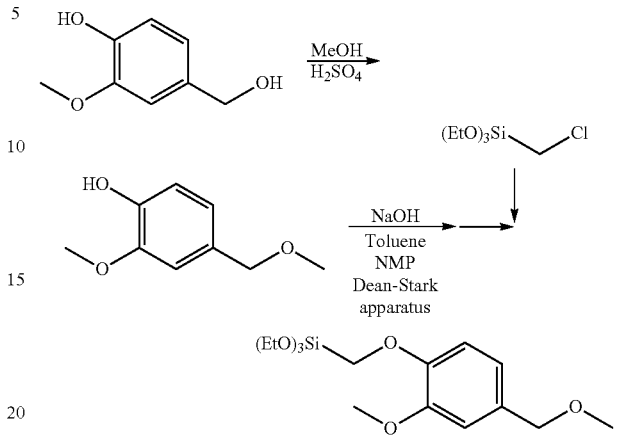

To a 1000-ml eggplant-shaped flask with a magnetic stirrer, 20.0 g of vanillyl alcohol and 400.0 g of methanol were added and dissolved. To this solution, 0.25 g of concentrated sulfuric acid was added and heated for reflux for 1 hour. After the solution was returned to room temperature and neutralized with sodium hydroxide, methanol was removed by evaporation. The product was put into a 300-ml three-necked flask, to which 5.19 g of sodium hydroxide, 40 g of toluene, and 40 g of NMP were added to allow a reaction to proceed for 4 hours while removing water and toluene in an oil bath at 130° C. Then, 27.60 g of chloromethyltriethoxysilane was added dropwise, and heating and stirring was performed at 130° C. for 4 hours. The resultant solution was returned to room temperature and put into a separating funnel, to which 120 g of toluene and 90 g of water were added to wash the organic phase. The washing was repeatedly performed three times. Next, the organic phase was dried with addition of magnesium sulfate and then filtered, and the solvent was removed by evaporation to yield a crude product. Subsequently, the crude product was purified by reduced-pressure distillation to yield 15 g of Compound 3 of interest.

$^1$H-NMR (500 MHz, DMSO-d$_6$): 1.20 ppm (t, 9H), 3.26 ppm (s, 3H), 3.68 ppm (s, 2H), 3.75 ppm (s, 3H), 3.87 ppm (q, 6H), 4.32 ppm (s, 2H), 6.83 ppm (d, 1H), 6.89 ppm (s, 1H), 7.00 ppm (d, 2H)

Synthesis of Compound 4

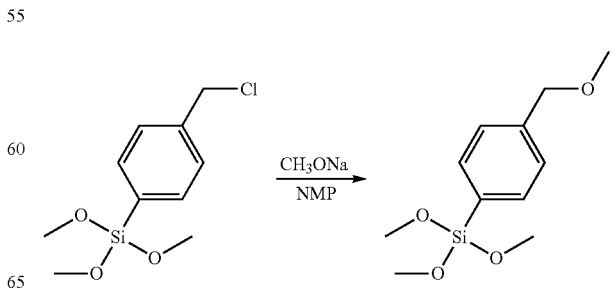

To a 300-ml three-necked flask with a magnetic stirrer, 40 g of 4-chloromethylphenyltrimethoxysilane (manufactured by Gelest Inc.) and 80 g of NMP were added and heated to 130° C. and stirred in an oil bath. To this solution, 8.76 g of sodium methoxide was added, and heating and stirring was performed at 130° C. for 4 hours. The resultant solution was returned to room temperature and put into a separating funnel, to which 200 g of toluene and 100 g of water were added to wash the organic phase. The washing was repeatedly performed three times. Next, the organic phase was dried with addition of magnesium sulfate and then filtered, and the solvent was removed by evaporation to yield a crude product. Subsequently, the crude product was purified by reduced-pressure distillation to yield 5 g of Compound 4 of interest.

$^1$H-NMR (500 MHz, DMSO-$d_6$): 3.30 ppm (s, 3H), 3.53 ppm (s, 9H), 4.43 ppm (s, 2H), 7.37 ppm (d, 2H), 7.56 ppm (d, 2H)

Synthesis of Compound 5

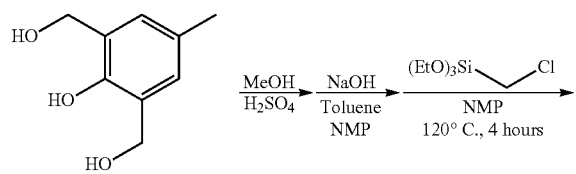

To a 1000-ml eggplant-shaped flask, 20.00 g (0.119 mol) of 2,6-bis(hydroxymethyl)-p-cresol, 400 g of methanol, and 0.23 g (0.002 mol) of concentrated sulfuric acid were put and heated in a reflux state for 20 hours. After the product was returned to room temperature and neutralized with sodium hydroxide, methanol was removed by evaporation. The product was put into a 300-ml three-necked flask, to which 40 g of toluene, 40 g of N-methylpyrrolidone, and 4.99 g (0.125 mol) of sodium hydroxide were added to allow a reaction to proceed for 4 hours while removing water and toluene in an oil bath at 130° C. Then, 25.30 g (0.119 mol) of chloromethyltriethoxysilane was added dropwise to allow a reaction to proceed at 120° C. for 4 hours. After the reaction solution was subjected to liquid-separation extraction with toluene and acetone, and water, the organic solvent was removed with an evaporator to yield a crude product. The crude product was distilled under reduced pressure to obtain the compound of interest.

$^1$H-NMR (500 MHz, DMSO-$d_6$): 1.23 ppm (t, 9H), 2.26 ppm (s, 3H), 3.31 ppm (s, 6H), 3.59 ppm (s, 2H), 3.89 ppm (q, 6H), 4.40 ppm (s, 4H), 7.10 ppm (s, 21-1)

(Synthesis of Compound 6/4-(trimethoxysilyl)benzyl acetate)

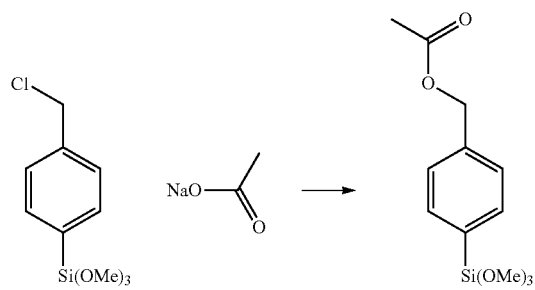

To a 300-ml three-necked flask with a magnetic stirrer, 30.0 g of sodium acetate and 150.0 g of NMP were added and heated to 130° C. in an oil bath. Then, 90.25 g of (p-chloromethyl)phenyltrimethoxysilane was added dropwise, and heating and stirring was performed for 4 hours. The resultant solution was returned to room temperature and put into a separating funnel, to which 300 g of toluene and 90 g of water were added to wash the organic phase. The washing was repeatedly performed three times. Next, the organic phase was dried with addition of magnesium sulfate and then filtered, and the solvent was removed by evaporation to yield a crude product. Subsequently, the crude product was purified by reduced-pressure distillation to yield 60 g of 4-(trimethoxysilyl)benzyl acetate of interest.

$^1$H-NMR (500 MHz, DMSO-$d_6$): 2.08 ppm (s, 3H), 3.54 ppm (s, 9H), 5.10 ppm (s, 2H), 7.42 ppm (d, 2H), 7.58 ppm (d, 2H)

Synthesis of Compound 7

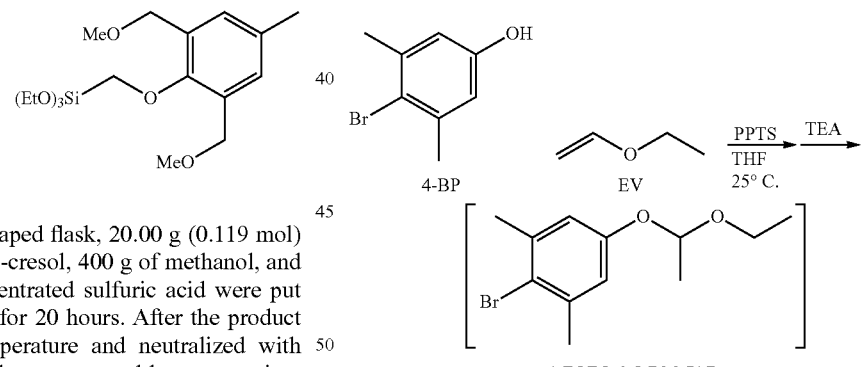

-continued

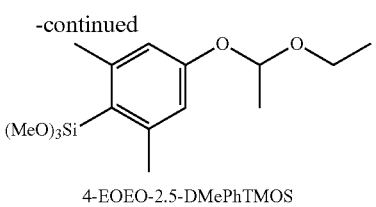

4-EOEO-2,5-DMePhTMOS

To a 300-ml eggplant-shaped flask with a magnetic stirrer, 42.0 g of 4-bromo-3,5-dimethylphenol (4-BP), 94.6 g of tetrahydrofuran (THF) (dehydrated) and 1.57 g of pyridinium p-toluenesulfonate (PPTS) were added and dissolved. To this solution, 22.59 g of ethyl vinyl ether (EV) was added to allow a reaction to proceed at room temperature for 20 hours. The solution was neutralized with 0.63 g of triethylamine (TEA) to prepare a reaction solution A (including 4-(1-ethoxyethoxy)-2,6-dimethylbromobenzene (4-EOEO-2,6-DMePhBr)). To a 500-ml three-necked flask with a stir bar, 6.09 g of dried magnesium powder, 0.53 g of iodine, and 189.2 g of tetrahydrofuran (dehydrated) were added and heated in an oil bath at 60° C. until the color of iodine was lost. Thereafter, the temperature was returned to room temperature, and the reaction solution A was added dropwise at room temperature to allow a reaction to proceed for 2 hours to yield a reaction solution B. To a 1000-ml three-necked flask with a stir bar, 95.39 g of tetramethoxysilane (TMOS) and 189.2 g of tetrahydrofuran (dehydrated) were added and stirred. At room temperature, the reaction solution B was added dropwise to allow a reaction to proceed for 2 hours. After the resultant solution was concentrated by evaporation, 500 ml of a heptane solution was added and stirred, followed by filtration. After the resultant filtrate was concentrated, the product was purified by reduced-pressure distillation to yield 35 g of (4-(1-ethoxyethoxy)-2,6-dimethylphenyl)trimethoxysilane of interest (4-EOEO-2,6-DMePhTMOS).

$^1$H-NMR (500 MHz, DMSO-$d_6$): 1.06 ppm (t, 3H), 1.34 ppm (d, 3H), 2.36 ppm (s, 6H), 3.47 ppm (s, 9H), 3.53 ppm (multi, 2H), 5.46 ppm (q, 1H), 6.61 (s, 2H)

Synthesis Example 1

To a 100-ml reaction flask, 0.251 g of a 35% by mass tetraethylammonium aqueous solution, 0.777 g of water, 7.014 g of isopropanol, and 3.846 g of tetrahydrofuran were added and stirred. Then, 5 g (50 mol % in the entire silane) of Compound 3 and 4.157 g (50 mol % in the entire silane) of (4-(1-ethoxyethoxy)phenyl)trimethoxysilane were added at room temperature and heated to 40° C. to allow a reaction to proceed for 6 hours. The temperature was returned to room temperature, and 54.942 g of ethyl acetate and 27.471 g of water were added, and the product was neutralized with a 0.1 N acetic acid aqueous solution. After the product was put into a separating funnel and washed with water three times, 25 g of propylene glycol monomethyl ether acetate was added, and the organic phase was concentrated to perform solvent displacement. The resultant polymer corresponds to Formula (3-1) as Polymer 1 and had a molecular weight of Mw 7200.

Synthesis Example 2

To a 100-ml reaction flask, 0.263 g of a 35% by mass tetraethylammonium aqueous solution, 0.815 g of water, 7.169 g of isopropanol, and 3.931 g of tetrahydrofuran were added and stirred. Then, 5 g (50 mol % in the entire silane) of Compound 1 and 4.360 g (50 mol % in the entire silane) of (4-(1-ethoxyethoxy)phenyl)trimethoxysilane were added at room temperature and heated to 40° C. to allow a reaction to proceed for 6 hours. The temperature was returned to room temperature, 56.157 g of ethyl acetate and 28.08 g of water were added, and the product was neutralized with a 0.1 N acetic acid aqueous solution. After the product was put into a separating funnel and washed with water three times, 25 g of propylene glycol monomethyl ether acetate was added, and the organic phase was concentrated to perform solvent displacement. The resultant polymer corresponds to Formula (3-2) as Polymer 2 and had a molecular weight of Mw 12800.

Synthesis Example 3

To a 100-ml reaction flask, 0.178 g of a 35% by mass tetraethylammonium aqueous solution, 0.553 g of water, 4.18 g of isopropanol, and 2.290 g of tetrahydrofuran were added and stirred. Then, 2.5 g (50 mol % in the entire silane) of Compound 4 and 2.955 g (50 mol % in the entire silane) of (4-(1-ethoxyethoxy)phenyl)trimethoxysilane were added at room temperature and heated to 40° C. to allow a reaction to proceed for 6 hours. The temperature was returned to room temperature, 32.73 g of ethyl acetate and 16.36 g of water were added, and the solution was neutralized with a 0.1 N acetic acid aqueous solution. After the product was put into a separating funnel and washed with water three times, 25 g of propylene glycol monomethyl ether acetate was added, and the organic phase was concentrated to perform solvent displacement. The resultant polymer corresponds to Formula (3-3) as Polymer 3 and had a molecular weight of Mw 7300.

Synthesis Example 4

To a 100-ml reaction flask, 0.232 g of a 35% by mass tetraethylammonium aqueous solution, 0.719 g of water, 6.775 g of isopropanol, and 7.315 g of tetrahydrofuran were added and stirred. Then, 5 g (50 mol % in the entire silane) of Compound 5 and 3.844 g (50 mol % in the entire silane) of (4-(1-ethoxyethoxy)phenyl)trimethoxysilane were added at room temperature and heated to 40° C. to allow a reaction to proceed for 6 hours. The temperature was returned to room temperature, 53.06 g of ethyl acetate and 26.53 g of water were added, and the product was neutralized with a 0.1 N acetic acid aqueous solution. After the product was put into a separating funnel and washed with water three times, 25 g of propylene glycol monomethyl ether acetate was added, and the organic phase was concentrated to perform solvent displacement. The resultant polymer corresponds to Formula (3-4) as Polymer 4 and had a molecular weight of Mw 2200.

Synthesis Example 5

To a 100-ml reaction flask, 0.287 g of a 35% by mass tetraethylammonium aqueous solution, 0.888 g of water, 8.001 g of isopropanol, and 4.387 g of tetrahydrofuran were added and stirred. Then, 4 g (35 mol % in the entire silane) of Compound 3, 4.751 g (50 mol % in the entire silane) of (4-(1-ethoxyethoxy)phenyl)trimethoxysilane, and 1.695 g (15 mol % in the entire silane) of trimethoxy(3-(phenanthren-9-yl)propyl)silane were added at room temperature and heated to 40° C. to allow a reaction to proceed for 6 hours. The temperature was returned to room temperature, 62.67 g of ethyl acetate and 31.34 g of water were added, and the product was neutralized with a 0.1 N acetic acid aqueous solution. After the product was put into a separating funnel and washed with water three times, 25 g of propylene glycol monomethyl ether acetate was added, and the organic phase was concentrated to perform solvent displacement. The resultant polymer corresponds to Formula (3-5) as Polymer 5 and had a molecular weight of Mw 5200.

Synthesis Example 6

To a 100-ml reaction flask, 0.287 g of a 35% by mass tetraethylammonium aqueous solution, 0.888 g of water, 7.959 g of isopropanol, and 4.364 g of tetrahydrofuran were added and stirred. Then, 4 g (35 mol % in the entire silane) of Compound 3, 4.751 g (50 mol % in the entire silane) of (4-(1-ethoxyethoxy)phenyl)trimethoxysilane, and 1.640 g (15 mol % in the entire silane) of carbazole propyltrimethoxysilane were added at room temperature and heated to 40° C. to allow a reaction to proceed for 6 hours. The temperature was returned to room temperature, 62.34 g of ethyl acetate and 31.17 g of water were added, and the product was neutralized with a 0.1 N acetic acid aqueous solution. After the product was put into a separating funnel and washed with water three times, 25 g of propylene glycol monomethyl ether was added, and the organic phase was concentrated to perform solvent displacement. The resultant polymer corresponds to Formula (3-6) as Polymer 6 and had a molecular weight of Mw 5000.

Synthesis Example 7

To a 100-ml reaction flask, 0.287 g of a 35% by mass tetraethylammonium aqueous solution, 0.888 g of water, 7.910 g of isopropanol, and 7.951 g of tetrahydrofuran were added and stirred. Then, 4 g (35 mol % in the entire silane) of Compound 3, 4.751 g (50 mol % in the entire silane) of (4-(1-ethoxyethoxy)phenyl)trimethoxysilane, and 1.575 g (15 mol % in the entire silane) of (4-(methylthio)phenoxy)methyltriethoxysilane were added at room temperature and heated to 40° C. to allow a reaction to proceed for 6 hours. The temperature was returned to room temperature, 61.96 g of ethyl acetate and 30.98 g of water were added, and the product was neutralized with a 0.1 N acetic acid aqueous solution. After the product was put into a separating funnel and washed with water three times, 25 g of propylene glycol monomethyl ether acetate was added, and the organic phase was concentrated to perform solvent displacement. The resultant polymer corresponds to Formula (3-7) as Polymer 7 and had a molecular weight of Mw 5600.

Synthesis Example 8

To a 100-ml reaction flask, 0.287 g of a 35% by mass tetraethylammonium aqueous solution, 0.888 g of water, 7.750 g of isopropanol, and 4.318 g of tetrahydrofuran were added and stirred. Then, 4 g (35 mol % in the entire silane) of Compound 3, 4.751 g (50 mol % in the entire silane) of (4-(1-ethoxyethoxy)phenyl)trimethoxysilane, and 1.530 g (15 mol % in the entire silane) of 8-(3-(trimethoxysilyl)propoxy)quinoline were added at room temperature and heated to 40° C. to allow a reaction to proceed for 6 hours. The temperature was returned to room temperature, 61.96 g of ethyl acetate and 30.98 g of water were added, and the product was neutralized with a 0.1 N acetic acid aqueous solution. After the product was put into a separating funnel and washed with water three times, 25 g of propylene glycol monomethyl ether was added, and the organic phase was concentrated to perform solvent displacement. The resultant polymer corresponds to Formula (3-8) as Polymer 8 and had a molecular weight of Mw 4300.

Synthesis Example 9

To a 100-ml reaction flask, 0.287 g of a 35% by mass tetraethylammonium aqueous solution, 0.888 g of water, 8.196 g of isopropanol, and 4.494 g of tetrahydrofuran were added and stirred. Then, 4 g (35 mol % in the entire silane) of Compound 3, 4.751 g (50 mol % in the entire silane) of (4-(1-ethoxyethoxy)phenyl)trimethoxysilane, and 1.949 g (15 mol % in the entire silane) of 4-methoxy-N-(3-(triethoxysilyl)propyl)benzenesulfonamide were added at room temperature and heated to 40° C. to allow a reaction to proceed for 6 hours. The temperature was returned to room temperature, 64.20 g of ethyl acetate and 32.10 g of water were added, and the product was neutralized with a 0.1 N acetic acid aqueous solution. After the product was put into a separating funnel and washed with water three times, 25 g of propylene glycol monomethyl ether was added, and the organic phase was concentrated to perform solvent displacement. The resultant polymer corresponds to Formula (3-9) as Polymer 9 and had a molecular weight of Mw 4800.

Synthesis Example 10

To a 100-ml reaction flask, 8.88 g of a 35% by mass tetraethylammonium aqueous solution, 30.72 g of isopropanol, and 30.72 g of tetrahydrofuran were added and stirred. Then, 3.62 g (10 mol % in the entire silane) of Compound 3, 3.01 g (10 mol % in the entire silane) of (4-(1-ethoxyethoxy)phenyl)trimethoxysilane, and 15.00 g (80 mol % in the entire silane) of methyltriethoxysilane were added at room temperature and heated to 40° C. to allow a reaction to proceed for 4 hours. The temperature was returned to room temperature, 129.81 g of ethyl acetate was added, and the product was neutralized with a 0.2 N hydrochloric acid aqueous solution. After the product was put into a separating funnel and washed with water three times, 25 g of propylene glycol monomethyl ether acetate was added, and the organic phase was concentrated to perform solvent displacement. The resultant polymer corresponds to Formula (3-10) as Polymer 10 and had a molecular weight of Mw 1500.

Synthesis Example 11

To a 100-ml reaction flask, 1.541 g of a 35% by mass tetraethylammonium aqueous solution, 7.99 g of isopropanol, and 7.99 g of tetrahydrofuran were added and stirred. Then, 0.63 g (10 mol % in the entire silane) of Compound 3 and 5.00 g (90 mol % in the entire silane) of (3-biphenoxy)methyltriethoxysilane were added at room temperature and heated to 40° C. to allow a reaction to proceed for 4 hours. The temperature was returned to room temperature, 33.77 g of ethyl acetate was added, and the product was neutralized with a 0.2 N hydrochloric acid aqueous solution. After the product was put into a separating funnel and washed with water three times, 25 g of propylene glycol monomethyl ether acetate was added, and the organic phase was concentrated to perform solvent displacement. The resultant polymer corresponds to Formula (3-11) as Polymer 11 and had a molecular weight of Mw 3500.

Synthesis Example 12

To a 100-ml reaction flask, 0.34 g of a 35% by weight tetraethylammonium aqueous solution, 1.94 g of ultrapure water, 4.13 g of isopropanol, and 4.13 g of tetrahydrofuran were added and stirred. Then, 6.89 g of Compound 3, 2.36 g of acetoxymethyltriethoxysilane, and 3.14 g of (4-(1-ethoxyethoxy)-2,6-dimethylphenyl)trimethoxysilane (compound 7) were added at room temperature and heated to 40° C. to allow a reaction to proceed for 4 hours. The temperature was returned to room temperature, 62.00 g of ethyl acetate was added, and the product was neutralized with a 0.1 N acetic acid aqueous solution. After the product was put into a separating funnel and washed with water three times, 30 g of propylene glycol monomethyl ether acetate was added, and the organic phase was concentrated to perform solvent displacement. The resultant polymer corresponds to Formula (3-12) as Polymer 12 and had a molecular weight of Mw 4000.

Synthesis Example 13

To a 100-ml reaction flask, 0.419 g of a 35% by weight tetraethylammonium aqueous solution, 2.42 g of ultrapure water, 5.45 g of isopropanol, and 5.45 g of tetrahydrofuran were added and stirred. Then, 8.57 g of Compound 3, 1.53 g of triethoxy(3-((tetrahydro-2H-pyran-2yl)oxy)propyl)silane, and 6.26 g of (4-(1-ethoxyethoxy)-2,6-dimethylphenyl)trimethoxysilane (Compound 7) were added at room temperature and heated to 40° C. to allow a reaction to proceed for 4 hours. The temperature was returned to room temperature, 82.00 g of ethyl acetate was added, and the product was neutralized with a 0.1 N acetic acid aqueous solution. After the product was put into a separating funnel and washed with water three times, 30 g of propylene glycol monomethyl ether acetate was added, and the organic phase was concentrated to perform solvent displacement. The resultant polymer corresponds to Formula (3-13) as Polymer 13 and had a molecular weight of Mw 2800.

Synthesis Example 14

To a 100-ml reaction flask, 0.34 g of a 35% by weight tetraethylammonium aqueous solution, 1.94 g of ultrapure water, 4.13 g of isopropanol, and 4.13 g of tetrahydrofuran were added and stirred. Then, 6.89 g of Compound 3, 2.36 g of 3-glycidoxypropyltrimethoxysilane, and 3.14 g of (4-(1-ethoxyethoxy)-2,6-dimethylphenyl)trimethoxysilane (Compound 7) were added at room temperature and heated to 40° C. to allow a reaction to proceed for 4 hours. The temperature was returned to room temperature, 62.00 g of ethyl acetate was added, and the product was neutralized with a 0.1 N acetic acid aqueous solution. After the product was put into a separating funnel and washed with water three times, 30 g of propylene glycol monomethyl ether acetate was added, and the organic phase was concentrated to perform solvent displacement. The resultant polymer corresponds to Formula (3-14) as Polymer 14 and had a molecular weight of Mw 3800.

Comparative Synthesis Example 1

To a 100-ml reaction flask, 0.436 g of a 35% by mass tetraethylammonium aqueous solution, 1.351 g of water, 9.362 g of isopropanol, and 5.133 g of tetrahydrofuran were added and stirred. Then, 5.000 g (50 mol % in the entire silane) of phenyltrimethoxysilane and 7.222 g (50 mol % in the entire silane) of (4-(1-ethoxyethoxy)phenyl)trimethoxysilane were added at room temperature and heated to 40° C. to allow a reaction to proceed for 4 hours. The temperature was returned to room temperature, 73.33 g of ethyl acetate was added, and the product was neutralized with a 0.1 N acetic acid aqueous solution. After the product was put into a separating funnel and washed with water three times, 25 g of propylene glycol monomethyl ether acetate was added, and the organic phase was concentrated to perform solvent displacement. The resultant polymer corresponds to Formula (4-1) as Polymer 12 and had a molecular weight of Mw 5200.

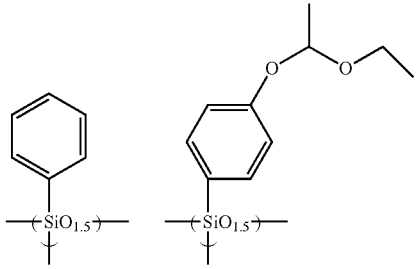

Formula (4-1)

Preparation of Curable Resin Composition

The silicon-containing polymers obtained in Synthesis Examples 1 to 14 and Comparative Synthesis Example 1 above, an acid, a curing catalyst, an additive, and a solvent were mixed in the ratio shown in Table 1 and filtered through a 0.02 μm fluorocarbon resin filter to prepare the solutions of curable resin compositions as film-forming compositions. The proportion of the polymer in Table 1 is shown not by the mass of the polymer solution but by the mass of the polymer itself.

In Table 1, triphenylsulfonium trifluoromethanesulfonate is denoted as TPS105, p-toluenesulfonate pyridinium salt is denoted as pPTS, propylene glycol monomethyl ether acetate is denoted as PGMEA, propylene glycol monomethyl ether is denoted as PGME, and the nonionic surfactant manufactured by DIC Corporation is denoted as R30N (product name). Ultrapure water was used as water. The amount added is shown by pails by mass.

TABLE 1

| | Polymer | Curing catalyst | Additive | Solvent | |
|---|---|---|---|---|---|
| Example 1 | Polymer 1 | pPTS | | PGME | PGMEA |
| (parts by mass) | 4 | 0.04 | | 30 | 70 |
| Example 2 | Polymer 2 | pPTS | | PGME | PGMEA |
| (parts by mass) | 4 | 0.04 | | 30 | 70 |
| Example 3 | Polymer 3 | pPTS | | PGME | PGMEA |
| (parts by mass) | 4 | 0.04 | | 30 | 70 |
| Example 4 | Polymer 4 | pPTS | | PGME | PGMEA |
| (parts by mass) | 4 | 0.04 | | 30 | 70 |
| Example 5 | Polymer 5 | pPTS | | PGME | PGMEA |
| (parts by mass) | 4 | 0.04 | | 30 | 70 |
| Example 6 | Polymer 6 | pPTS | | PGME | PGMEA |
| (parts by mass) | 4 | 0.04 | | 30 | 70 |
| Example 7 | Polymer 7 | pPTS | | PGME | PGMEA |
| (parts by mass) | 4 | 0.012 | | 30 | 70 |
| Example 8 | Polymer 8 | pPTS | TPS105 | PGME | PGMEA |
| (parts by mass) | 4 | 0.024 | 0.04 | 30 | 70 |
| Example 9 | Polymer 9 | pPTS | TPS105 | PGME | PGMEA |
| (parts by mass) | 4 | 0.024 | 0.12 | 30 | 70 |
| Example 10 | Polymer 5/Polymer | pPTS | TPS105 | PGME | PGMEA |
| (parts by mass) | 12 2/2 | 0.024 | 0.12 | 30 | 70 |

TABLE 1-continued

|  | Polymer | Curing catalyst | Additive | Solvent | |
|---|---|---|---|---|---|
| Example 11 (parts by mass) | Polymer 10 8 | pPTS 0.048 | R30N 0.04 | PGME 30 | PGMEA 70 |
| Example 12 (parts by mass) | Polymer 11 8 | pPTS 0.24 |  | PGME 30 | PGMEA 70 |
| Example 13 (parts by mass) | Polymer 12 4 | pPTS 0.04 |  | PGME 50 | PGMEA 50 |
| Example 14 (parts by mass) | Polymer 13 4 | pPTS 0.04 |  | PGME 50 | PGMEA 50 |
| Example 15 (parts by mass) | Polymer 14 4 | pPTS 0.04 | TPS105 0.04 | PGME 50 | PGMEA 50 |
| Comparative Example 1 (parts by mass) | Polymer 12 4 | pPTS 0.04 |  | PGME 30 | PGMEA 70 |
| Comparative Example 2 (parts by mass) | Polymer 12 8 | pPTS 0.24 |  | PGME 30 | PGMEA 70 |

(Measurement of Optical Constant)

The curable resin compositions prepared in Examples 1 to 15 and Comparative Examples 1 to 2 were each applied on a silicon wafer using a spinner. The composition was heated on a hot plate at 215° C. for 1 minute to form a curable resin composition film (film thickness of 0.05 μm). The refractive index (n value) and the optical absorption coefficient (k value, which may be called attenuation coefficient) of the curable resin composition film were measured using a spectroscopic ellipsometer (manufactured by J. A. Woollam Co., VUV-VASEVU-302).

(Curability Evaluation)

The curable resin compositions prepared in Examples 1 to 15 and Comparative Examples 1 to 2 were each applied on a silicon wafer using a spinner. The composition was heated on a hot plate at 215° C. for 1 minute to form a curable resin composition film (film thickness of 0.05 μm). Subsequently, the film was dipped in propylene glycol monomethyl ether acetate. The film thicknesses before and after dipping were measured, and the one with a change of 5 nm or more was evaluated as x.

(Lithography Evaluation)

Trade name: EHPE3150 (40.0 g) manufactured by DAICEL CORPORATION, 9-anthracenecarboxylic acid (20.3 g), and benzoic acid (13.7 g) were dissolved in propylene glycol monomethyl ether (302.0 g), and then 1.5 g of benzyltriethylammonium was added to allow reflux for 24 hours for a reaction. After the reaction, the solution was purified using the ion exchange process to obtain a polymer solution. The resultant polymer (corresponding to Formula (5-1)) was analyzed by GPC, and the weight average molecular weight was 4100 in terms of standard polystyrene.

To 5 g of the resultant polymer solution (the solid content of the polymer is 16% by mass), 0.2 g of tetramethoxymethyl glycol uril, 0.03 g of pyridinium-p-toluenesulfonate, 0.0008 g of MEGAFACE [registered trademark] R-30 (manufactured by DIC Corporation (the former Dainippon Ink and Chemicals, Inc.), trade name), 6.4 g of propylene glycol monomethyl ether, and 4.5 g of propylene glycol monomethyl ether acetate were mixed to form a solution. Subsequently, the solution was filtered using a polyethylene microfilter with a pore size of 0.10 μm and further filtered using a polyethylene microfilter with a pore size of 0.05 μm to prepare a solution of the organic resist underlayer film-forming composition for use in the lithography process with multilayer films.

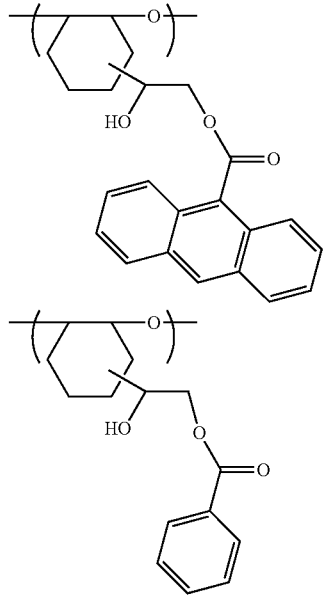

Formula (5-1)

The organic resist underlayer film-forming composition was applied on a silicon wafer and baked on a hot plate at 240° C. for 60 seconds to obtain an organic resist underlayer film having a film thickness of 200 nm. The curable resin compositions prepared in Examples 1 to 10, Examples 13 to 15 and Comparative Example 1 were each applied thereon using a spinner. Subsequently, the resin composition was baked on a hot plate at 215° C. for 1 minute to form a curable resin film (film thickness of 0.08 μm). A commercially available photoresist solution (manufactured by TOKYO OHKA KOGYO CO., LTD., trade name: TDUR-P3435LP) was applied thereon using a spinner and heated on a hot plate at 90° C. for 1 minute to form a photo resist film (film thickness of 0.25 μm). Then, using an NSR-S205C lens scanning-type stepper (wavelength 248 nm, NA: 0.75, σ: 0.85 (CONVENTIONAL)) manufactured by Nikon Corporation, exposure was performed through a mask set such that the photoresist pattern after development has a line width and a line-to-line width of 0.16 μm. Subsequently, "post exposure bake" was performed on a hot plate at 110° C. for 1 minute. After cooling, development was performed using a 2.38% tetramethylammonium hydroxide aqueous solution as a developer. The resist bottom shape of the resultant pattern was evaluated by SEM. Those with a rectangular resist shape are evaluated as straight, and those with no resultant pattern or with loss of rectangularity are evaluated as pattern failure.

(Filling Evaluation)

As shown in FIG. 1, the curable resin compositions of Examples 1 to 15 and Comparative Examples 1 to 2 were each applied on an uneven substrate 2 using a spin coater and then heated on a hot plate at 215° C. for 1 minute to form a curable resin film 1 having a film thickness of 180 nm. The uneven substrate used had a hole pattern formed of CVD-TEOS with a height of 300 nm and a minimum width of 20 nm. The hole-filling characteristic was then evaluated by observing the hole-filling shape (embeddability) in the resultant substrate through cross section SEM. Those with no voids and exhibiting high embeddability were evaluated as good.

TABLE 2

Refractive index n with wavelength of 248 nm, optical absorption coefficient and curability evaluation, hole-filling characteristic

| | n/k (248 nm) | Curability evaluation | Lithography evaluation | Hole-filling characteristic |
|---|---|---|---|---|
| Example 1 | 1.87/0.08 | ○ | Straight | Good |
| Example 2 | 1.87/0.05 | ○ | Straight | Good |
| Example 3 | 1.83/0.02 | ○ | Straight | Good |
| Example 4 | 1.82/0.02 | ○ | Straight | Good |
| Example 5 | 1.79/0.22 | ○ | Straight | Good |
| Example 6 | 1.86/0.18 | ○ | Straight | Good |
| Example 7 | 1.86/0.10 | ○ | Straight | Good |
| Example 8 | 1.89/0.18 | ○ | Straight | Good |
| Example 9 | 1.87/0.11 | ○ | Straight | Good |
| Example 10 | 1.81/0.11 | ○ | Straight | Good |
| Example 13 | 1.83/0.10 | ○ | Straight | Good |
| Example 14 | 1.88/0.10 | ○ | Straight | Good |
| Example 15 | 1.79/0.08 | ○ | Straight | Good |
| Comparative Example 1 | 1.83/0.01 | X | Pattern failure | — |

TABLE 3

Refractive index n with wavelength of 633 nm, curability evaluation

| | n (633 nm) | Curability evaluation | Hole-filling characteristic |
|---|---|---|---|
| Example 11 | 1.480 | ○ | Good |
| Example 12 | 1.618 | ○ | Good |
| Comparative Example 2 | 1.570 | X | — |

INDUSTRIAL APPLICABILITY

The film-forming composition of the present invention has high curability and has high embeddability for an uneven substrate. In addition, in the use for a resist underlayer film for use in the lithography process for semiconductor manufacturing using multilayer films, or for silicon hard masks, satisfactory shapes can be achieved after exposure, development, and etching.

The present invention can be used as a film-forming composition having favorable effects such as curability and embeddability and a resist underlayer film for use in the lithography process for semiconductor devices.

DESCRIPTION OF THE REFERENCE NUMERALS

1 Curable resin film
2 Uneven substrate

The invention claimed is:

1. A film-forming composition, the composition comprising:
as a silane, a hydrolyzable silane, a hydrolysis product thereof, or a hydrolysis-condensation product thereof, wherein
the hydrolyzable silane includes a hydrolyzable silane of Formula (1):

Formula (1)

wherein $R^1$ is an organic group of Formula (2) and is bonded to a silicon atom through a Si—C bond or a Si—O bond:

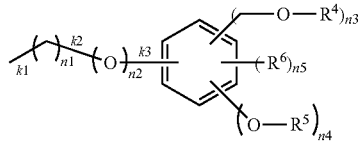

Formula (2)

wherein $R^4$ is a hydrogen atom, a $C_{1-10}$ alkyl group, or an acyl group, $R^5$ is a hydrogen atom, a $C_{1-10}$ alkyl group, or a $C_{1-10}$ alkyl group having a $C_{1-10}$ alkoxy group, $R^6$ is a $C_{1-10}$ alkyl group, n1 is an integer of 0 to 10, n2 is an integer of 0 or 1, n3, n4 and n5 are integers, where n3 satisfies 1≤n3≤5, n4 satisfies 0≤n4≤4, and n5 satisfies 0≤n5≤4, k1 is a bond end with a silicon atom when n1 is an integer of 1 to 10, k2 is a bond end with a silicon atom when n1 is 0 and n2 is 1, and k3 is a bond end with a silicon atom when n1 and n2 are 0;
$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond;
$R^3$ is an alkoxy group, an acyloxy group, or a halogen group;
a is an integer of 1;
b is an integer of 0 to 2; and
a+b is an integer of 1 to 3.

2. The film-forming composition according to claim 1, wherein
the hydrolyzable silane is a combination of the hydrolyzable silane of Formula (1) with another hydrolyzable silane, in which the other hydrolyzable silane is at least one hydrolyzable silane selected from the group consisting of:
a hydrolyzable silane of Formula (3):

Formula (3)

wherein $R^7$ is an alkyl group, an aryl group, a halogenated alkyl group, a halogenated aryl group, an alkoxyalkyl group, an alkoxyaryl group, an alkoxyalkoxyaryl group, an alkenyl group, or an organic group having an epoxy group, an acryloyl group, a methacryloyl group, a mercapto group, a sulfonamide group, or a cyano group, or a combination thereof, and is bonded to a silicon atom through a Si—C bond, $R^8$ is an alkoxy group, an acyloxy group, or a halogen group, and c is an integer of 0 to 3 and a hydrolyzable silane of Formula (4):

Formula (4)

wherein $R^9$ is an alkyl group and is bonded to a silicon atom through a Si—C bond, $R^{10}$ is an alkoxy group, an acyloxy group, or a halogen group, Y is an alkylene group or an arylene group, d is an integer of 0 or 1, and e is an integer of 0 or 1.

3. The film-forming composition according to claim 1, further comprising a salt.

4. The film-forming composition according to claim 1, wherein the film-forming composition is a resist underlayer film-forming composition for use in a lithography process.

5. A resist underlayer film formed on a semiconductor substrate, comprising a cured product of the resist underlayer film-forming composition as claimed in claim 4.

6. A method of producing a semiconductor device comprising:
- a step of applying the resist underlayer film-forming composition as claimed in claim 4 on a semiconductor substrate and baking the resist underlayer film-forming composition to form a resist underlayer film;
- a step of applying a resist composition on the resist underlayer film to form a resist film;
- a step of exposing the resist film;
- a step of developing the resist film after exposure to obtain a resist pattern;
- a step of etching the resist underlayer film using the resist pattern; and
- a step of processing the semiconductor substrate using the patterned resist and the resist underlayer film.

7. A method of producing a semiconductor device comprising:
- a step of forming an organic underlayer film on a semiconductor substrate;
- a step of applying the resist underlayer film-forming composition as claimed in claim 4 on the organic underlayer film and baking the resist underlayer film-forming composition to form a resist underlayer film;
- a step of applying a resist composition on the resist underlayer film to form a resist film;
- a step of exposing the resist film;
- a step of developing the resist film after exposure to obtain a resist pattern;
- a step of etching the resist underlayer film using the resist pattern;
- a step of etching the organic underlayer film using the patterned resist underlayer film; and
- a step of processing the semiconductor substrate using the patterned organic underlayer film.

8. A film-forming composition, the composition comprising:
as a polymer, a hydrolysis-condensation product of a hydrolyzable silane composed of a combination of:
the hydrolyzable silane of Formula (1):

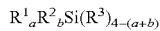  Formula (1)

wherein $R^1$ is an organic group of Formula (2) and is bonded to a silicon atom through a Si—C bond or a Si—O bond:

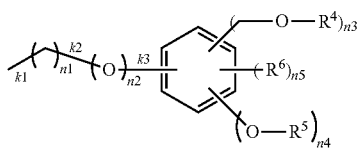  Formula (2)

wherein $R^4$ is a hydrogen atom, a $C_{1-10}$ alkyl group, or an acyl group, $R^5$ is a hydrogen atom, a $C_{1-10}$ alkyl group, or a $C_{1-10}$ alkyl group having a $C_{1-10}$ alkoxy group, $R^6$ is a $C_{1-10}$ alkyl group, n1 is an integer of 0 to 10, n2 is an integer of 0 or 1, n3, n4 and n5 are integers, where n3 satisfies 1≤n3≤5, n4 satisfies 0≤n4≤4, and n5 satisfies 0≤n5≤4, k1 is a bond end with a silicon atom when n1 is an integer of 1 to 10, k2 is a bond end with a silicon atom when n1 is 0 and n2 is 1, and k3 is a bond end with a silicon atom when n1 and n2 are 0;
$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond;
$R^3$ is an alkoxy group, an acyloxy group, or a halogen group;
a is an integer of 1;
b is an integer of 0 to 2; and
a+b is an integer of 1 to 3; and
the hydrolyzable silane of Formula (3):

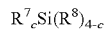  Formula (3)

wherein $R^7$ is an alkyl group, an aryl group, a halogenated alkyl group, a halogenated aryl group, an alkoxyalkyl group, an alkoxyaryl group, an alkoxyalkoxyaryl group, an alkenyl group, or an organic group having an epoxy group, an acryloyl group, a methacryloyl group, a mercapto group, a sulfonamide group, or a cyano group, or a combination thereof, and is bonded to a silicon atom through a Si—C bond, $R^8$ is an alkoxy group, an acyloxy group, or a halogen group, and c is an integer of 0 to 3.

9. A hydrolyzable silane of Formula (1'):

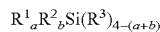  Formula (1')

wherein $R^1$ is an organic group of Formula (2') and is bonded to a silicon atom through a Si—C bond or a Si—O bond:

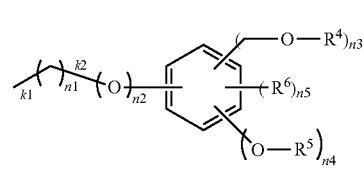  Formula (2')

wherein
$R^4$ is a hydrogen atom, a $C_{1-10}$ alkyl group, or an acyl group,
$R^5$ is a hydrogen atom, a $C_{1-10}$ alkyl group, or a $C_{1-10}$ alkyl group having a $C_{1-10}$ alkoxy group,
$R^6$ is a $C_{1-10}$ alkyl group,
n1 is an integer of 0 to 10, n2 is an integer of 0 or 1, wherein n1 and n2 are not 0 at the same time,
n3, n4, and n5 are integers, where n3 satisfies 1≤n3≤5, n4 satisfies 0≤n4≤4, and n5 satisfies 0≤n5≤4,
k1 is a bond end with a silicon atom when n1 is 1 to 10, and
k2 is a bond end with a silicon atom when n1 is 0 and n2 is 1;
$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond;
$R^3$ is an alkoxy group, an acyloxy group, or a halogen group;
a is an integer of 1;
b is an integer of 0 to 2; and
a+b is an integer of 1 to 3.

* * * * *